(12) United States Patent
Secareanu

(10) Patent No.: US 11,677,416 B2
(45) Date of Patent: Jun. 13, 2023

(54) HARDWARE IMPLEMENTABLE DATA COMPRESSION/DECOMPRESSION ALGORITHM

(71) Applicant: Radu Mircea Secareanu, Phoenix, AZ (US)

(72) Inventor: Radu Mircea Secareanu, Phoenix, AZ (US)

(73) Assignee: Radu Mircea Secareanu, Phoenix, AZ (US)

( * ) Notice: Subject to any disclaimer, the term of this patent is extended or adjusted under 35 U.S.C. 154(b) by 0 days.

(21) Appl. No.: 17/398,728

(22) Filed: Aug. 10, 2021

(65) Prior Publication Data

US 2022/0368345 A1 Nov. 17, 2022

Related U.S. Application Data

(60) Provisional application No. 63/189,247, filed on May 17, 2021.

(51) Int. Cl.
*H03M 7/30* (2006.01)
*H03M 7/40* (2006.01)

(52) U.S. Cl.
CPC ....... *H03M 7/3064* (2013.01); *H03M 7/4031* (2013.01); *H03M 7/6005* (2013.01)

(58) Field of Classification Search
None
See application file for complete search history.

(56) References Cited

U.S. PATENT DOCUMENTS

| | | | | |
|---|---|---|---|---|
| 3,656,178 A * | 4/1972 | De Maine | ........... | H03M 7/3066 341/87 |
| 3,914,586 A * | 10/1975 | McIntosh | ................ | H03M 7/30 341/68 |
| 4,021,782 A * | 5/1977 | Hoerning | ................ | H03M 7/42 341/51 |
| 5,036,457 A * | 7/1991 | Glaser | ....................... | G06F 7/00 703/22 |
| 5,298,895 A * | 3/1994 | Van Maren | ...... | G11B 20/00007 341/51 |
| 5,363,098 A * | 11/1994 | Antoshenkov | .......... | G06T 9/005 341/95 |

(Continued)

*Primary Examiner* — Lam T Mai

(57) ABSTRACT

A hardware implementable lossless data compression decompression algorithm is disclosed, where the input data string is described in term of consecutive groups of alternating same type bits, where one of these groups of same type bits is defined as a preferred group with the other groups having either lower or higher number of same type bits, where the data string is partitioned into variable length processing strings where the variable length is determined by the occurrence of the preferred group or of a determined number of bits consisting of groups of lower number of same type bits, where these variable length processing strings are processed function of the configuration and content of each processing string only, where consecutive processing strings are additionally processed based on their content only, where processing is performed in a loop until a certain target performance is achieved, where processing is done without any data analysis, and where no negative compression gain is achieved for any content of an input string.

28 Claims, 17 Drawing Sheets

(56) References Cited

U.S. PATENT DOCUMENTS

| | | | | |
|---|---|---|---|---|
| 5,455,943 | A * | 10/1995 | Chambers, IV | G06F 16/90344 |
| | | | | 708/203 |
| 5,479,164 | A * | 12/1995 | Yorks | H04Q 11/0003 |
| | | | | 250/568 |
| 5,572,209 | A * | 11/1996 | Farmer | G06F 16/1744 |
| | | | | 341/67 |
| 5,933,104 | A * | 8/1999 | Kimura | H03M 7/3086 |
| | | | | 341/51 |
| 6,535,150 | B1 * | 3/2003 | Ross | G06F 16/2237 |
| | | | | 341/67 |
| 6,624,762 | B1 * | 9/2003 | End, III | H03M 7/3088 |
| | | | | 708/203 |
| 7,630,394 | B2 * | 12/2009 | Matias | H04L 69/04 |
| | | | | 709/228 |
| 9,997,165 | B2 * | 6/2018 | Grancharov | G10L 19/0017 |
| 11,044,495 | B1 * | 6/2021 | Dupont | H04N 19/48 |
| 2002/0196166 | A1 * | 12/2002 | Satoh | H03M 7/3084 |
| | | | | 382/229 |
| 2006/0170574 | A1 * | 8/2006 | Itani | H04L 9/0656 |
| | | | | 341/51 |
| 2008/0030384 | A1 * | 2/2008 | Yokose | H03M 7/30 |
| | | | | 341/59 |
| 2011/0109485 | A1 * | 5/2011 | Kataoka | H03M 7/40 |
| | | | | 341/65 |
| 2012/0268297 | A1 * | 10/2012 | Kataoka | H03M 7/40 |
| | | | | 341/65 |
| 2015/0002320 | A1 * | 1/2015 | Kataoka | G06F 5/00 |
| | | | | 341/65 |
| 2015/0143197 | A1 * | 5/2015 | Klein | H03M 7/02 |
| | | | | 714/767 |
| 2020/0279003 | A1 * | 9/2020 | Dupont | G06F 16/90344 |

* cited by examiner

200

011_001_110_000_001_011_101_111_011_111

201   202

203

String 200 description using FB and AB:

206

FB=0
AB structure: 1_2_2_3_6_1_1_3_1_4_1_5

204

String 200 after RB transformation:

FB=0
RB transformation:                          205
    10_101_001_000_001_110_011_000_110_000
AB structure:
    1_1_1_1_1_2_1_5_3_2_2_3_2_4

| 701 | Sum1 | Sum2 | Sum3 | Sum4 | Sum5 |
|---|---|---|---|---|---|
| | (702) | (703) | (704) | (705) | (706) |
| 1 | 1 | 11 | 111 | 1111 | 11111 |
| 2 | | 2 | 12 | 112 | 1112 |
| 3 | | | 21 | 121 | 1121 |
| 4 | | | 3 | 211 | 1211 |
| 5 | | | | 22 | 2111 |
| 6 | | | | 13 | 122 |
| 7 | | | | 31 | 212 |
| 8 | | | | 708 → 4 | 221 |
| 9 | 707 | | | | 113 |
| 10 | | | | | 131 |
| 11 | | | | | 311 |
| 12 | | | | | 23 |
| 13 | | | | | 32 |
| 14 | | | | | 709 → 14 |
| 15 | | | | | 710 → 41 |
| 16 | | | | | 711 → 5 |

FIG. 7

|  | 801 | 802 Actual | 803 Sum4 | 804 Description | 805 Actual | 806 Sum5 | 807 Description |
|---|---|---|---|---|---|---|---|
| | 1 | 1111 | | 000 | 11111 | | 0000 |
| | 2 | 112 | | 001 | 1112 | | 0001 |
| | 3 | 121 | | 010 | 1121 | | 0010 |
| | 4 | 211 | | 011 | 1211 | | 0011 |
| | 5 | 22 | | 100 | 2111 | | 0100 |
| | 6 | 13 | | 101 | 122 | | 0101 |
| | 7 | 31 | | 110 | 212 | | 0110 |
| | 8 | 4 | | 808 — 111 | 221 | | 0111 |
| | 9 | | | | 113 | | 1000 |
| | 10 | | | | 131 | | 1001 |
| | 11 | | | | 311 | | 1010 |
| | 12 | | | | 23 | | 1011 |
| | 13 | | | | 32 | | 1100 |
| | 14 | | | | 14 | 809 — | 1101 |
| | 15 | | | | 41 | 810 — | 1110 |
| | 16 | | | | 5 | 811 — | 1111 |

*FIG. 8*

| | 901 | 902 Need | 903 Available | 904 Remain | 905 Worth |
|---|---|---|---|---|---|
| | Sum4 | 7 | 8 | 1 | |
| | Sum5 | 13 | 16 | 3 | |
| | Sum6 | 24 | 32 | 8 | |
| | Sum7 | 44 | 64 | 20 | |
| | Sum8 | 81 | 128 | 47 | |
| | Sum9 | 149 | 256 | 107 | |
| | Sum10 | 274 | 512 | 238 | |
| | Sum11 | 504 | 1024 | 520 | |
| | Sum12 | 927 | 2048 | 1121 | |
| | Sum13 | 1705 | 4096 | 2391 | |
| | Sum14 | 3136 | 8192 | 5056 | |

- exception PS (4, 5, and greater) ← 1201

- full PS of class 1_4 to 27_4 ← 1202

- open string of 28 bits (class 25_3, 26_2, 27_1) ← 1203

- gap classes (class 26_3, 27_2, 27_3) ← 1204

FIG. 12

| Same type bits in a group | Representation |
|---|---|
| 1 | 0 |
| 2 | 10 |
| 3 | 110 |
| 4 | 1110 |
| 5 | 11110 |
| ... | ... |
| N | 111....110 (N-1) |
| ... | ... |
| 31 | 111....110 (30) |

1301 — Same type bits column
1302 — Representation column
1303 — N
1304 — N-1
1305 — 31
1306 — 30

FIG. 13

|   | 1401 | 1402 | 1403 | 1404 | 1405 |   |
|---|------|------|------|------|------|---|
|   | Class | ICAC | Identifier | ODC |   |
| 1 | 4_ | 1111 | 0100 | 000 | ⎫ 1406 |
| 2 | 4_4 | 112 | 0100 | 001 | ⎬ |
| 3 | 4_4 | 121 | 0100 | 010 | ⎭ |
| 4 | 4_4 | 211 | 0100 | 011 | ⎫ 1407 |
| 5 | 4_4 | 22 | 0100 | 100 | ⎬ |
| 6 | 4_4 | 13 | 0100 | 101 | ⎭ |
| 7 | 4_4 | 31 | 0100 | 110 | — 1408 |
| 8 | 27_4 | All | 0100 | 111 | — 1409 |

FIG. 14

| 1501 | 1502<br>Number of bits in root identifier | 1503<br>How many root identifiers | 1504<br>How many root identifiers after redistribution |
|---|---|---|---|
| 1 | 4 | 5 | 4 ← 1505 |
| 2 | 5 | 7 | 8 |
| 3 | 6 | 11 | 12 |
| 4 | 7 | 18 | 1 ← 1506 |
| 5 | 8 | 22 | 59 |
| 6 | 9 | 21 | 21 ← 1507 |
| 7 | 10 | 17 | 19 |
| 8 | 11 | 20 | 24 |
| 9 | 12 | 10 | 10 |
| 10 | 13 | 2 | 2 |
| 11 | 14 | 2 | 2 |
| 12 | 15 | 3 | 3 |
| 13 | 16 | 2 | 2 |

*FIG. 15*

HARDWARE IMPLEMENTABLE DATA COMPRESSION/DECOMPRESSION ALGORITHM

CROSS-REFERENCE TO RELATED APPLICATIONS

Application claims benefit of the following provisional application:
EFS ID: 42733523
Application No.: 63/189,247
Applicant name: Radu Mircea Secareanu
Filing Date: 17 May 2021

FIELD

The present disclosure relates to data compression/decompression algorithms, and in particular to data compression/decompression algorithms that are suitable to be implemented in silicon, as a circuit, in addition (or not only) to be implementable in software.

BACKGROUND

Multiple compression/decompression algorithms exist, classified as lossless (where the original data is restored from the compressed file without any loss of data), and lossy (where some of the original data is lost during the restoration). This loss of data is assumed, for reasons such as the human eye does not perceive the loss. The present disclosure is a lossless compression/decompression technique, therefore, the lossy techniques will only be briefly outlined, while the focus for this background section will be on lossless techniques.

As mentioned, numerous lossless and lossy techniques exist. Among the lossless techniques, the following can be mentioned:
a. Run Length Encoding (RLE)—based on identifying consecutive sequence of symbols.
b. Huffman—uses the probability distribution of a so-called alphabet of symbols, and assigns code words pursuant to probabilities (smaller code words for higher probabilities). Static Huffman and Adaptive Huffman have been developed.
c. Lempel Zew Welch—it is a dictionary based technique, where a file is read and a code is given to each found character
d. Burrows-Wheeler Transform—transforms a block of input data such that the amount of runs of identical characters is maximized
e. Arithmetic Coding—transforms the input data into a single rational number between zero and one, by changing the base and assigning a single value to each unique symbol from zero up to the base, where the base is the number of unique symbols in the input. Arithmetic coding can be considered as the best entropy coding technique if the objective is the best compression ratio, but it is quite complicated and involved as compared to the rest of the techniques.

Based on these techniques, as well as others, combining them, multiple algorithms have been developed, such as:
i. LZ77—is the first algorithm that introduced the "sliding window concept". It s a dictionary based algorithm, using offset, run-length, and a deviating character.
ii. LZR—is an improvement/modification of LZ77.
iii. LZSS (Lempel-Ziv-Storer-Szymanski) is yet another improvement of LZ77.
iv. Deflate—combines LZ77 (or LZSS) with Huffman, and is the basis of the majority of compression tasks today, including the widely used gzip. Deflate64 improves on Deflate.
v. LZH, LZB, ROLZ, and others, are various improvements and optimizations of LZ77 and LZSS.
vi. LZP—introduces prediction in the LZ77 (and derivates) family.
vii. LZRW introduces reduced offset in LZ family, while LZJB address speed optimizations in LZRW.
viii. LZS, LZX, LZO, LZMA are further optimizations of various algorithm performance factors. LZMA is used in 7zip software.
ix. Statistical Lempel-Ziv—operates on a statistical analysis of the data combined with an LZ77 variant.
x. LZ78—it is a dictionary-based algorithm, where the input file is either pre-processed to create the dictionary, or the dictionary is built-up as the file is parsed.
xi. LZW, LZWL, LZJ, are improvements and optimizations of LZ78.

Another family of algorithms are non-dictionary based:
a) PPM—prediction by partial matching—is a statistical modelling technique that uses a set of previous symbols in the input to predict what the next symbol will be. PPM is implemented in 7-zip and RAR software.
b) Bzip2 Uses RLE combined with Burrows-Wheeler Transform. It is used in bzip2 software.
c) PAQ it is an improvement of PPM, using a technique called "context mixing". A version of PAQ is used in PeaZip software.

Other algorithms:
A. BPE—Byte Pair Encoding—most common pair of consecutive bytes of data is replaced with a byte that does not occur within the data.
B. Delta encoding—Data is stored, or transmitted, in the form of differences between sequential files.
C. LOCO-I—combines. Huffman with context models. Is the core of a new ISO/ITU standard for lossless or near-lossless continuous tone images.
D. Zstandard—used in the original zip and gzip software, it is optimized for speed, at the performances of Deflate.
E. Brotli—combines LZ77, Huffman, and second-order context modelling.
F. Clustering-based compression
G. MLP—Meridian Lossless Packing—is the standard lossless compression method for Audio-DVD.
H. Deep Coder—is from the Convolutional Neural Network (CNN) based framework, and is used for video compression primarily.
I. Generative Adversarial Network (GAN) based compression—is an alternative to neural networks. These techniques can compress data more than 2.5 times more efficient than traditional methods. It compresses the images based on the most matching features. Decompression is made based on the predictions that were made.

Among the lossy techniques/algorithms, MP3, MP4, AAC, WMA, etc., can be mentioned.

Successful attempts have been made to implement lossless techniques in hardware. The following such attempts can be mentioned: FPGA-LOCO-I, Snappy, LZMA, Block GC3.

Note that all the above-mentioned techniques/algorithms require, or are based on (sometimes extensively) the analysis of the to-be compressed data, or on the pre-processing of the named data, or on data built (such as a dictionary). This data analysis, or pre-processing, or built, is suitable for software implementation primarily. In comparison, the algorithm disclosed here, takes the data as is, i.e. as presented to, or inputted to, or received by the algorithm, to produce an immediate compressed output, therefore requiring no data analysis, pre-processing, or built, to name a few. This is also one of the fundamental reasons, and a major enabling advantage of the subject disclosure, why the algorithm (or technique) that is disclosed here is suitable for seamless hardware implementation.

SUMMARY

There are two primary aspects that are disclosed:
a. The compression/decompression algorithm (or method, or technique) in itself
b. The suitability of the disclosed compression/decompression technique for hardware implementation Across the disclosure, the compression/decompression algorithm will be referred to as "algorithm", or "method", or "technique", all being equivalent.

Regarding the first disclosed aspect—the compression/decompression algorithm in itself. At the onset, a note regarding the structure of this disclosure is required, note that will enable better understanding of the flow of the disclosure. Key concepts are being introduced, defined, and detailed, concepts that the disclosed embodiments are based on. The algorithm in progressively introduced during this process.

In summary, the algorithm works as follows: an Initial Full Data String (IFDS) is serially partitioned into a number of sequential Processing Strings (PS), where the length of each PS is determined by the occurrence of a fixed bit pattern, called Delimiter (DE) or by the reach of a set limit number of bits. Every such determined PS is classified and compressed in two independent ways:
a) individually, every PS is compressed as a whole, and
b) the said PS classification of every two adjacent PS, are compressed Once the end of the IFDS is reached, it is called that the end of one cycle is reached. The process can be repeated using as new IFDS the output of the just completed cycle, since the said output has a very different structure as compared to the initial input IFDS. This cycle repeat is possible also because the algorithm is designed such that, no matter the IFDS content, the output corresponding to any PS content is never at a data loss—it is either 0 (no gain), or gain. Unlimited number of cycles can be processed for unlimited compression, the only theoretical limit being that an IFDS cannot be smaller than a certain number of bits. The decompression is perfectly mirrored to the compression process, leading to an identical restored file to the initial IFDS, which was the input to the first cycle.

Regarding the second disclosed aspect—the suitability of the disclosed algorithm for hardware implementation. As will be apparent from the details presented in this disclosure to a person familiar with digital design, the algorithm can be immediately implemented using basic digital circuitry. For example, every determined PS, which in the example provided is no more than 32 bits in length, becomes an address to a memory, where the output of said memory is the compressed output corresponding to that PS. In addition, due to the serial nature of the algorithm, the various stages of combinatorial logic are suitable to be placed in a pipeline (again, a concept familiar for people skilled in digital design).

A brief discussion concerning hardware aspects:
The pipelining implementation approach will theoretically permit that at every "clock cycle" a valid output is generated (such as at every clock cycle, a PS is processed and a corresponding compressed output is generated). For the sake of exemplification, if a clock frequency of 1 GHz is considered, then, theoretically, $10^9$ PS can be processed.

As mentioned, for an individual trained in digital design, it is apparent that high clock frequencies will not necessarily accommodate the critical path of every combinatorial logic path. While pipelining can be extended to accommodate all situations, for a conservative and realistic pipelined implementation, a PS can be processed in 10 clock cycles, resulting in 100 million processed PS per second using a 1 GHz clock. A skilled party, employing high performance digital design, can push this performance characteristic more aggressively, or, at the same time, function of the application demands as well, can relax this performance characteristic resulting in less demanding hardware. These are aspects that are decided function of application and performance needs and are in no way limiting or restrictive for this disclosure.

The decompression can be implemented on a similar type of architecture, where, at a high level, just the content of the above mentioned memory is consequently and appropriately different.

Important to note for this disclosure is that the execution speed and resulting compression and decompression performance that is achievable by implementing the embodiments in this disclosure will open up a multitude of novel applications and advances of current state of the art.

In conclusion of this summary chapter, the embodiments that are disclosed here permit the following highlights to be stated:
i. The algorithm does not require any input data analysis. Only a horizon of one processing string (32 bits max) is typically required.
ii. The algorithm will partition an input data string in processing strings of maximum 32 bits
iii. For any content of a processing string, the algorithm output corresponding to that processing string is never at a data loss
iv. The algorithm can be implemented straightforward, in a pipelined, memory based architecture leading to a high data throughput
v. The compression speed is equal to the decompression speed

BRIEF DESCRIPTION OF DRAWINGS

Embodiments will be described, by way of example, with reference to the drawings, in which

FIG. 2 is used to introduce several key concepts for this disclosure, such as first bit (FB), alternate bits (AB), relative bits (RB), and RB transformation, concepts used in one or more of the embodiments.

FIG. 5 and FIG. 6 are used to introduce the concept of exception processing string (exception PS), concept used in one or more of the embodiments.

FIG. 7 and FIG. 8 are used to describe and discuss the structure of the core part of a full processing string, as well as to introduce the concepts of input core acceptable configuration (ICAC), output description configuration (ODC), and remain output description configuration (RODC), all used in one or more of the embodiments.

FIG. 12 is used to exemplify the classes and constructs used by the algorithm to cover any arbitrary input string, classes and constructs used in one or more of the embodiments.

FIG. 13 is used to introduce, illustrate, and exemplify the format of a termination processing string, in accordance to one or more of the embodiments FIG. 14 is used to introduce, illustrate, and exemplify, the concept, format, and derivation of root identifiers in accordance to one or more of the embodiments FIG. 15 illustrates the full list of root identifiers used in the algorithm, in accordance to one or more of the embodiments FIG. 16

DETAILED DESCRIPTION OF THE INVENTION

At the outset it should be noted that the examples presented in the disclosure are in no way limiting, and the skilled person will appreciate that the disclosure is equally applicable to multiple variations and alternatives, and multiple optimizations are possible to increase the performance metrics of the algorithm, such as the algorithm compression/decompression gain or the execution speed of one compression/decompression cycle.

Figure 1:
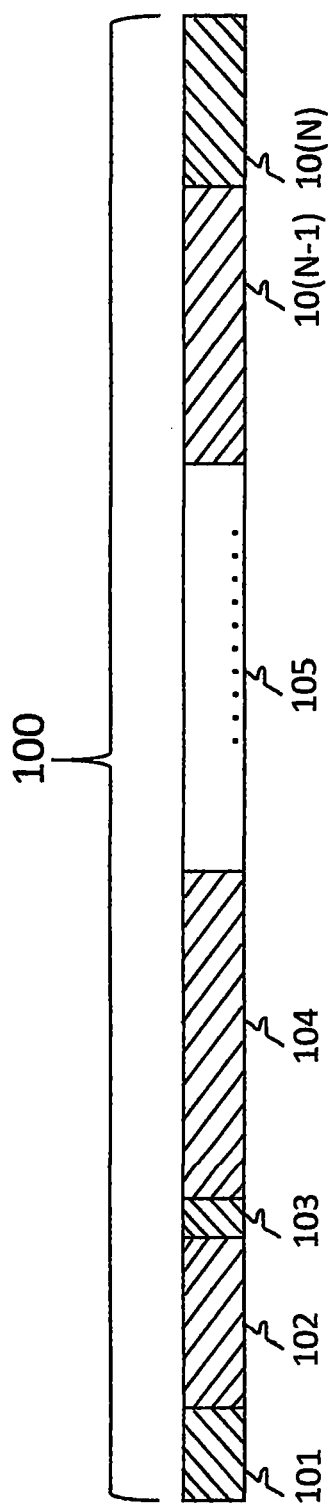
FIG. 1 illustrates an input full data string (IFDS) and the partition of this IFDS into processing strings (PS) according to one or more of the embodiments.

FIG. 1 illustrates an input full data string (IFDS→100) and the partition of this IFDS into processing strings (PS) according to one or more of the embodiments.

In FIG. 1, 101, 102, 103, 104, 10(N−1) and 10(N) are representing processing strings (PS). There are several types of processing strings as will be detailed in this disclosure; most of the PS are called full processing strings (definition of a full PS will be introduced a little later, to insure full understanding).

As depicted, the fact that the rectangles (abstract representation of PS) have different lengths is intentional and targets to represent the fact that PS have different lengths in term of number of bits.

In FIG. 1, 105, the dot marks, is intended to represent the fact that many PS are in the IFDS, while 10(N−1) is intended to represent the last full PS. 10(N) is intended to represent the remaining bits between the last full PS and the end of the string, 10(N) being also referred to as a termination PS in this disclosure.

The content of a full PS, as well as the content of a termination PS will be described next, in this disclosure.

FIG. 2 is used to introduce several key concepts for this disclosure, such as first bit (FB), alternate bits (AB), relative bits (RB), and RB transformation, concepts used in one or more of the embodiments.

a. In FIG. 2, an example data string is used to enable to introduce the above named concepts.

The example data string 200 consists of 30 bits. For clarity and ease to follow, underscores 202 are used every three bits.

The data string 200 consists of the following bit sequence: one 0, followed by two 1, followed by two 0, followed by three 1, followed by six 0, followed by one 1, followed by one 0, followed by three 1, followed by one 0, followed by four 1, followed by one 0, followed by five 1.

b. The first concept introduced is that of the first bit (FB). The FB for the data string 200 is 0, indicated in FIG. 2 by 201. In this algorithm, the FB of the initial IFDS will be always extracted and written to the algorithm output, for reasons that will become apparent.

c. The second concept introduced is that of alternate bits. As outlined above for string 200, different groups of same type bit (0 or 1) alternate.

To exemplify the concept of alternate bits, referring to the data string 200, the following groups of same type bit alternate: group of one 0, followed by group of two 1, followed by group of two 0, followed by group of three 1, followed by group of six 0, followed by group of one 1, followed by group of one 0, followed by group of three 1, followed by group of one 0, followed by group of four 1, followed by group of one 0, followed by group of five 1.

Using the first bit and the alternate bits concepts (FB and AB), data string 200 can be uniquely described as shown in FIG. 2 as 203. This unique description of a data string using FB and AB is used in all cases, for IFDS, in this algorithm.

Note that the content of the alternate bit configuration representing the data string 200 (and true for any IFDS) makes abstraction of the type of bit for every of the constituent groups—the type of bit for every of the constituent groups become redundant information—all is needed to know the type of bit for every constituent group is FB when AB structure is used.

d. The concepts of relative bit, RB, and that of RB transformation, are introduced next.

To exemplify the concepts, the data string 200 is used, where FB 201 is 0.

The rest of the bits, following 201, can be described in term of relative value between consecutive bits, either as "the same as previous bit" or as "changed from previous bit". If 0 is assigned to denote "the same as previous bit" and 1 to denote "changed from previous bit", the data string 200 is transformed as shown in FIG. 2 at 204, specifically at RB transformation 205.

When writing the string 200 after the RB transformation in term of AB structure, note how different is the straight AB structure 206 as compared to the AB structure 207 obtained after the RB transformation.

It is key to note that these are two representations of the same data string, and the two representations are very different. Having two different representations of the same string is very important as a differentiating embodiment in this disclosure, as will be described.

e. Across this disclosure, for practical reasons, the algorithm will be exemplified using the 203 style string description (without the RB transformation). At the end, the differentiating factors, when using the 205 style RB transformation will be outlined as new embodiments.

Figure 3:
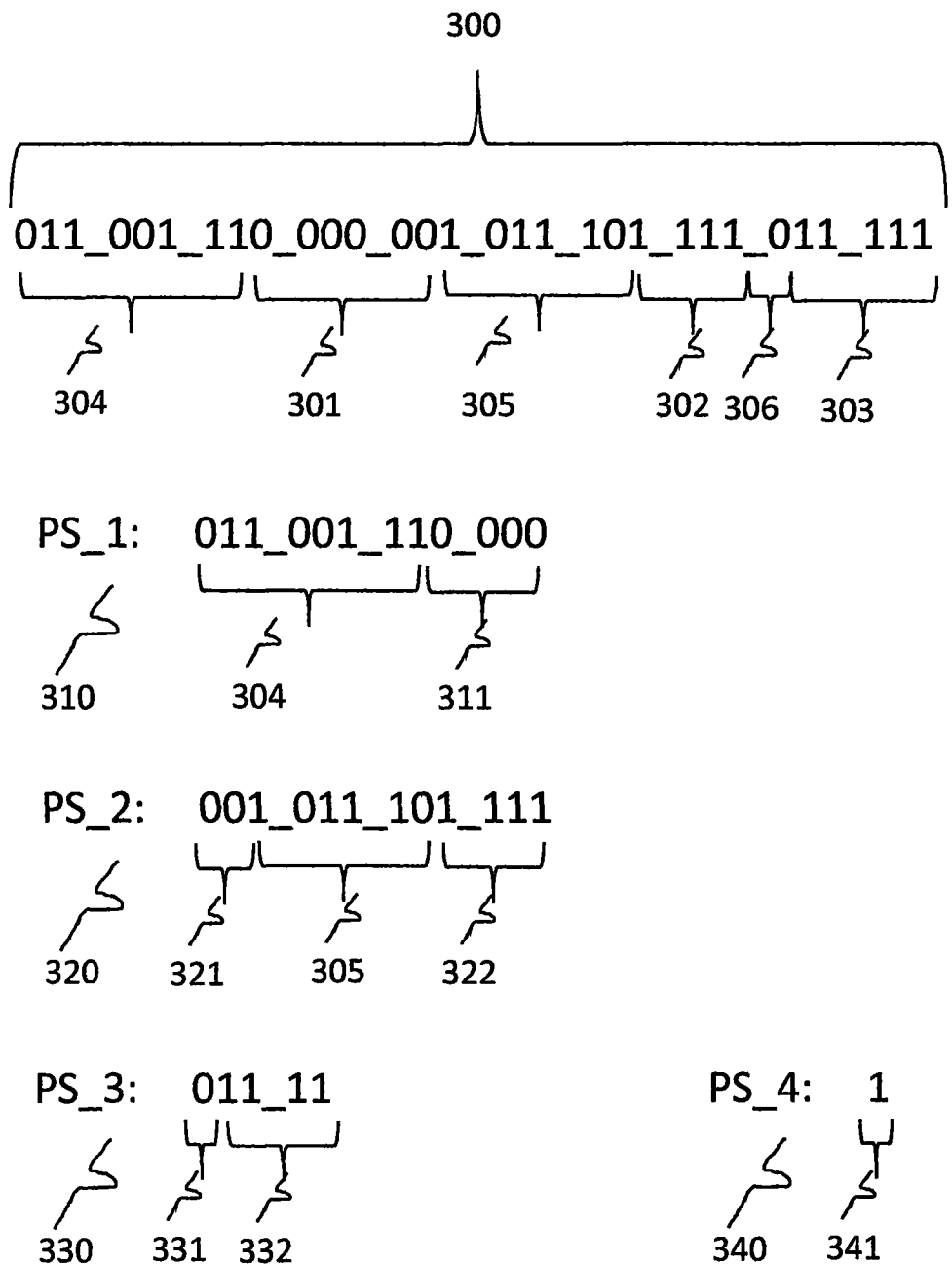
FIG. 3 is used to introduce additional key concepts for this disclosure, such as delimiter (DE) and link bit (link), concepts used in one or more of the embodiments.

FIG. 3 is used to introduce additional key concepts for this disclosure, such as delimiter (DE) and link bit (link), concepts used in one or more of the embodiments. Data string 300, used to introduce these concepts, is the same as data string 200, for continuity in term of understanding.

a. The concept of Delimiter (DE) is introduced, being defined as a preferred bit pattern.

The examples provided in this disclosure will use as the above named preferred bit pattern to be a group of four same type bits. This bit pattern is in no way limiting or restrictive to the disclosure, and a person skilled in the art can use a different bit pattern, possibly with the outcome to optimize or improve the algorithm performances such as the compression gain.

b. As mentioned, to exemplify the algorithm for this disclosure, a DE consisting of a group of four same type bits is used. The data string 300 has, accordingly, three delimiters: 301 (as part of the six bit group), 302 (as part of the four bit group) and 303 as part of the five bit group.

c. In a data string, obviously, there are groups of same type bits smaller than four (such as one, two, or three), and there are groups of same type bits larger than four (such as five, six, seven, and so on).

Groups of same type bits smaller than four are called in this disclosure as lower grade, while groups of same type bits larger than four are called in this disclosure as higher grade.

d. It is apparent that between two consecutive delimiters there are only lower grade groups. The same applies between the start of the string and the first delimiter in the string.

e. Since a delimiter can be part of a group of same type bits larger than four (as is the case in fact for delimiters 301 and 303 in string 300), the concept of link bit is introduced.

The link bit is always used after a delimiter, with one exception that will be detailed later in the disclosure.

The link bit is 0 if the bits following the delimiter are of the same type as the bits in the delimiter, and the link bit is 1 if the bits following the delimiter are of the opposite type then the bits in the delimiter. For example, in delimiters 301 and 303 of string 300, the link bit will be 0, because for 301, the delimiter is followed by two bits of the same type as the bits in the delimiter, and for 303, the delimiter is followed by one bit of the same type as the bits in the respective delimiter. For delimiter 302, the link bit is 1, because the delimiter is followed by one bit of opposite type than the bits in the delimiter.

f. When referring to an input data string, such as to an IFDS, all bits in-between two delimiters, or in-between the start of the string and the first delimiter, together with the four bits of the delimiter following these bits, form an input processing string (PS). In other words, for two consecutive delimiters, k and (k+1), all bits following the four bits of delimiter k up to and including the four bits of delimiter (k+1), form an input PS. There are several exceptions that will be detailed later in the disclosure, for proper understanding of the process.

For example, in string 300, the following input PS are formed, according to the above:
i. PS_1 (310), starts from the start of the string, and includes 304 and the delimiter 311 (part of 301)
ii. PS_2 (320), starts with 321 (the two bits remaining part of 301), followed by 305, followed by the four bits of delimiter 322 (which is 302)
iii. PS_3 (330), starts with 331 (the bit of opposite type following the delimiter 302), followed by the delimiter 332 (part of 303)
iv. PS4 (340), is a termination PS, as defined above, and consists of 341 (the remaining one bit part of 303)

g. Accordingly, the initial data string 300 is uniquely described by four input PS (310, 320, 330, 340).

Figure 4:
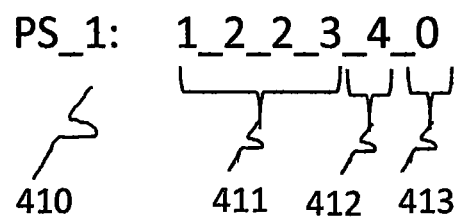
FIG. 4 is used to introduce additional key concepts for this disclosure, such as bit sum (Sum), processing string format (PS format), and PS classification (PS class), concepts used in one or more of the embodiments.
Figure 4:
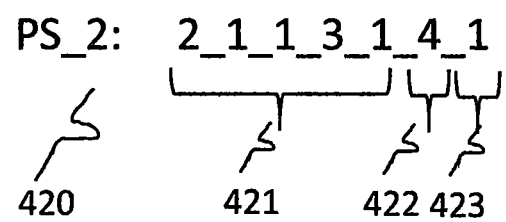
Figure 4:
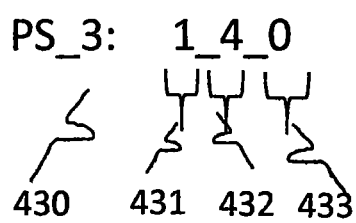
Figure 4:
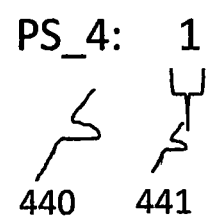

FIG. 4 is used to introduce additional key concepts for this disclosure, such as bit sum (Sum), processing string format (PS format), and PS classification (PS class), concepts used in one or more of the embodiments.

In order to properly introduce these concepts, the focus shifts on describing the four input PS in the string 300 in term of FB and AB. The string 300 can also be described with the RB transformation, leading to a completely different outcome, but as mentioned, the key differentiating aspects coming from using the RB transformation will be detailed at the appropriate time in this disclosure.

The description, or representation of the four input PS from string 300 in term of FB and AB, is introduced using FIG. 4. Note the following:

a. One FB per string (or IFDS) is sufficient.
b. As mentioned, up to this point, two types of input PS have been introduced: full PS, and at the very end of an IFDS, one termination PS.

Always, a full PS has the same format, as is exemplified for all three full PS examples (410, 420, and 430).
i. The full PS format always consists of three parts: core (411, 421, 431), delimiter (412, 422, 432) and link (413, 423, 433), respectively.
ii. The core and delimiter are always expressed in term of AB, while the link is expressed in absolute bit value (0 or 1, as introduced above).
iii. The core always consists of groups of same bits smaller than four (lower grade). The delimiter is always a group of four bits. And the link is always a one bit, in absolute value.

Adding all groups of lower grade in a core, results in a unique number representing that core. This number is called in this disclosure the core bit sum, and is referred to as Sum, or core characteristic number. To exemplify, the three Sum numbers for the three full PS, are:

a) For PS_1 (410), Sum is 1 plus 2 plus 2 plus 3→Sum=8
b) For PS_2 (420), Sum is 2 plus 1 plus 1 plus 3 plus 1→Sum=8
c) For PS_3 (430) Sum is 1→Sum=1

The three full PS are classified, for the purpose of use in one or more embodiments in this disclosure, as "Sum_4" (or Sum_delimiter). In string 300 therefore, there are three PS, classified as 8_4, 8_4, 1_4.

There is always one single termination PS per IFDS, and this termination PS has a different format than the full PS, format which will be detailed at the appropriate time in this disclosure. For string 300, this termination PS (PS_4) consists in one bit.

In conclusion with regard to FIG. 4, note that the data string 300 is uniquely described by the FB and the four PS 410, 420, 430, 440, where 410, 420, and 430 are full PS, where 410 and 420 belong to PS class 8_4, 430 belongs to PS class 1_4, and 440 is a termination PS.

It was mentioned that a link bit always follows a delimiter with one exception. This exception is detailed next, with regard to FIG. 5.

After a delimiter, any number of same type bits can follow, one, two, three, four, five, six, and greater. If this number is smaller than four, then these bits will be part of the core of the next PS, and the three full PS examples with regard to string 300 in FIG. 3 exemplified this situation. When this number is four or greater, these same type bits form yet another delimiter. This situation is shown in FIG. 5, in order to introduce the above referred exception.

In FIG. 5, considering the string 500, where the string is represented in term of FB, AB as 510, the following remarks can be made.

If 510 is described in term of full PS format as introduced above, the representation will be as shown by 520.

According to 520, the string 500 will be broken down into three PS, namely 521, 522, and 523, with 521 and 522 full PS, and 523 termination PS.

It must be noted at this time that this approach in describing using full PS the situation when a delimiter is followed by four or more same type bits, is notably inefficient and redundant. This is inefficient and redundant for two key reasons:

Large same type bit groups are fragmented, and
Multiple, unnecessary, redundant link bits are introduced.

The solution is to formulate a new concept describing a new type of PS, named exception PS, as follows:
After an input PS of class x_4, with x greater than zero, any same type bit group greater or equal to four will be preserved as is.

The exemplification of this exception PS rule is shown in FIG. 6. An exception PS is also referred to in this disclosure as special grade, or first grade.

a. The first exemplification is with regard to string 601, where 602 (the dots) signify that the string 601 continues with other multiple input PS that are not important for this exemplification.

603 is the 601 representation in term of FB, AB. Here, 604 represents the full PS (with the "0" after "4" representing the link bit), 605 represents the exception PS, and 606 represents other PS in the string which are not relevant for this exemplification.

Focusing on 605 (the exception PS), note that it has a very different format as compared to a full PS—it does not have a core and a link bit, and the delimiter can be any number greater or equal to four, where this number is equal to the number of bits in the group (six here).

The absence of the core is obviously the reason why this exception is triggered. The link bit is not necessary because it is automatically implied that the bit type changes after this group of same type bits.

b. The second exemplification is with regard to string 611. All notes made with regard to string 601 hold.

The string 611 example is provided here to outline that the exception PS 615 is of a different bit type than the bit type of the delimiter in the 614 full PS, as indicated by the link bit 1 in full PS 614.

Therefore, the point that is being made here is that the exception PS applies regardless if the bit type in the exception PS group maintains or changes the bit type from the previous delimiter.

c. The third exemplification is with regard to string 621.
The differentiating point made here is that the exception PS 625 has four same type bits, this being the minimum number to trigger an exception PS.

d. The fourth exemplification is with regard to string 631.
The differentiating point made here is that an exception PS (637) is also applicable when occurs as the first thing in an IFDS.

Concluding, there are three types of input PS used in this algorithm—full PS, exception PS, and termination PS.

The full PS format consists of core, delimiter, and link bit, where the delimiter is always four same type bits.

The exception PS format consist of delimiter only, where the delimiter is of any number of same type bits greater or equal to four. An exception PS occurs immediately after a full PS and can also be the first input PS in an IFDS.

A termination PS always occurs at the end of an IFDS. The format of a termination PS is discussed at the appropriate time, later in the disclosure.

It is time now to start focusing on introducing the necessary concepts to describe the compressed output of the algorithm, as used in one or more of the embodiments.

The first concept to focus on from this point of view is the output structure that corresponds to the core part of a full PS, output structure that has key implications on how the output of the algorithm will look like.

As discussed:
The core part of a full PS consists of multiple groups of same type bit, where these multiple groups are of 1, 2, or 3 same type bits only, i.e. multiple groups of lower grade.

Adding the bits in all these multiple groups results in a unique number characteristic for that respective input PS—this unique number is called Sum or characteristic number.

The full PS is called to be of class "Sum_4". Since Sum characterizes the core content, Sum makes sense only for a full PS, and Sum is always greater or equal to 1.

It is fundamental for this disclosure that the full PS, therefore the core, is described in term of AB.

Given all the above, FIG. 7 is used to describe and discuss the output structure that corresponds to the core part of a full PS. An example is depicted, example that is sufficient to explain the key points regarding this output structure.

In FIG. 7, the 701 column is an index, while columns 702, 703, 704, 705, and 706 describe all possible configurations in AB format, in the first five Sums supported by the algorithm, namely Sum1, Sum2, Sum3, Sum4, and Sum5. 707 (the doted square), is drawn just to contain all these configurations.

The above named possible configurations refer to all possible combinations of same type bit groups, which, when added, equals the respective Sum.

Accordingly, when a configuration is described for example by 112 for Sum4, it means that there are three alternating bit groups of same type bits, the first group of one bit, the second group of one bit, and the third group of two bits. This configuration can correspond to either 0100 or 1011 real bit structure. As described, 112 configuration is in AB format, and is uniquely defined by specifying FB (AB and FB are used as fundaments for this disclosure, as explained).

Continuing, as shown in FIG. 7:

Sum1 has one possible configuration, Sum2 has two possible configurations, Sum3 has four possible configurations, Sum4 has eight possible configurations, and Sum5 has 16 possible configurations.

Out, of the five Sums used in this example, Sum4 and Sum5 have configurations with four or more same type bits.

The key aspect to note is that configurations with four or more same type bits are not acceptable as part of a core, since the core can only contain lower grade groups.

Therefore, configuration 708 for Sum4, and configurations 709, 710, and 711 for Sum5, are not acceptable as part of a core.

This means that, for the embodiments applicable to this disclosure, Sum4 is described by 7 configurations that are acceptable for a core, and Sum5 is described by 13 configurations that are acceptable for a core.

This implies that for Sum4 one configuration remains and can be used for something else, while for Sum5, three configurations remain and can be used for something else.

The above named "use for something else" remain configurations is another fundamental aspect for this disclosure.

These configurations that are acceptable as part of a core, must be uniquely described for use in the algorithm output, using the minimum amount of bits. In other words, every unique input core acceptable configuration (ICAC) must have a unique output description configuration (ODC), where this ODC has minimum bits. Sum4 and Sum5 will be used to exemplify this correspondence, and FIG. 8 is used to help explain this correspondence. Obviously all configurations in all Sum must have such correspondence.

Sum4, as outlined above, has 7 ICAC, therefore, the minimum number of bits that can be used for ODC to represent these 7 ICAC is three bits.

Sum5, as outlined above, has 13 ICAC, therefore, the minimum number of bits that can be used for ODC to represent these 13 ICAC is four bits.

To generalize, all configurations in a Sum, having Sum number of bits, can be described using (Sum-1) number of bits.

An important note is required:

For Sum4, there should be four bits necessary, and for Sum5 there should be five bits necessary.

That is because, for example, configuration 112 in Sum4 can have two practical forms, 0100 and 1011.

However, because of the FB/AB representation that is used in this disclosure, this representation makes possible to uniquely identify each real configuration by a reduced set of configurations, making therefore possible that a Sum number of input bits to be described by (Sum-1) number of bits in the algorithm output. This aspect is fundamental for this disclosure.

Next, note in FIG. 8, the correspondence between every unique input core acceptable configuration (ICAC) in AB format and the unique output description configuration (ODC) of that respective input configuration, for both Sum4 and Sum5. Output description configuration (ODC) for this unique output configuration will be a standard name used across this disclosure. Some details about FIG. 8:

801 column is an index, 803 points to Sum4, 806 points to Sum5, 802 column describes all Sum4 input possible configurations in AB format, 804 column points to the corresponding output description configurations, 805 column describes all Sum5 input possible configurations in AB format, and 807 column points to the corresponding output description configurations of all Sum5 input configurations.

Note that in 802/805, all input configurations are described and not just the ICAC, and this is done intentionally, in order to make a point. The point that is being made with this is that there are very specific input configurations that are not core acceptable, and these input configurations correspond to very specific output description configurations (ODC) that are used for something else in this disclosure.

These ODC that correspond to input configurations that are not core acceptable for a class, and that will be used for something else in this disclosure, are called Remain ODC, or RODC).

As exemplified in FIG. 8, 808 points to the single remain ODC of Sum4, and 809, 810, and 811 point to the three remain ODC of Sum5.

Figures 9, 10:
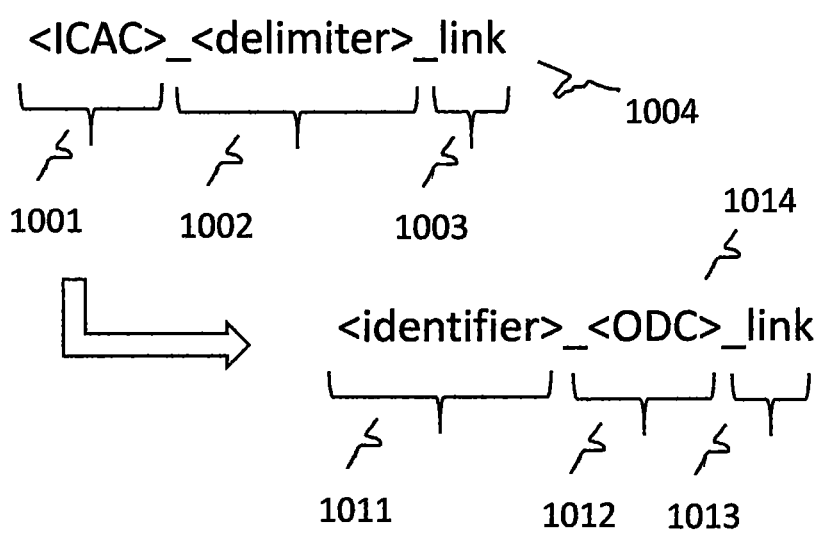
FIG. 9 illustrates the distribution and coverage dynamics of ICAC versus remain ODC for a key of processing strings used in this algorithm.
FIG. 10 is used to introduce the algorithm output format corresponding to a full PS, as used in one or more of the embodiments

As mentioned above, there is one remain ODC (RODC) for Sum4, and there are three RODC for Sum5. The higher the Sum, the more RODC. In FIG. 9, the number of RODC are described up to Sum14. The reason why Sum14 is used as an upper limit is explained a little later in the disclosure, to insure full understanding.

Important to note at this point is that Sum that is greater or equal than the number of bits in the delimiter feature RODC, while Sum that is smaller than the number of bits in the delimiter, do not feature RODC.

With respect to FIG. 9, note the following:

Column 901 lists all the Sum that feature RODC, up to Sum14, as mentioned.

Column 902 outlines the number of ICAC that are needed for each of these Sum.

Column 903 outlines the total number of ODC that are available for that respective Sum. For example, for Sum4, there are three bits used to describe, therefore there are eight ODC available.

Column 904 represents the difference between the Available (903) and Need (902), i.e. ODC minus ICAC, and outlines therefore the remain ODC (RODC) for every Sum, RODC which, as mentioned, is "used for something else" in this algorithm.

Column 905, labelled as "worth", will be explained a little later, to insure full understanding.

Note in FIG. 9 the following important aspects for this disclosure:

The numbers in column 902 (ICAC) increase from Sum to Sum at a notable slower ratio than two. This is very important, as will be described a little later in the disclosure, to insure full understanding.

The numbers in column 903 (ODC) increase monotonically by a factor of two from Sum to Sum.
This monotonic increase (doubling from Sum to Sum) is fully expected, since there is an extra bit between two consecutive Sums.
This is one of the reasons why the slower rate increase for "Need" mentioned at a. above is very important when compared to the factor of two "Available" rate increase, making the difference Available minus Need to notably increase as Sum increases.

As a consequence of the different rate of increase detailed at a. and b. above, note the numbers in column 904 (Remain), and compare, for each Sum, with the numbers in column 902 (Need).
Note for example that starting with Sum11, the remain number (column 904) is greater than the need number (column 902).
This can mean also that, for example, starting with Sum11, (Sum-2) number of bits can be used for the ODC, instead of (Sum-1).
A person skilled in the art can develop a version of the algorithm based on this observation, in particular since for example at Sum19 and above, (Sum-3) bits are sufficient, and at Sum26 and above, (Sum-4) bits are sufficient, and so on, the number of bits needed to uniquely represent all ICAC continue to drop as Sum increases.
The version of the algorithm that is described in this disclosure maintains the (Sum-1) number of bits for the ODC constant no matter the Sum, with the goal to maximize the remain ODC number and minimize the hardware needs, for reasons that are described a later in the disclosure.

Now that the core of a full PS is described in term of how it will look like in the output of the algorithm (ICAC will be ODC), it is time to introduce and discuss the entire output format corresponding to a full PS.
The format for a full PS has been shown to be core (ICAC), followed by 4 bit delimiter, followed by link.
The corresponding output format of this full PS will be introduced directly here, as identifier, followed by ODC, followed by link. FIG. 10 portrays this output format of a full PS.
In FIG. 10, 1004 is the format of the full PS and 1014 is the corresponding output format. For 1004, 1001 is the ICAC, 1002 is the delimiter, and 1003 is the link. For 1014, 1011 is the identifier, 1012 is the ODC, and 1013 is the link. 1003 is identical to 1013 (same link bit is transferred to the output). ODC (1012) has direct, unique, and one to one correspondence to ICAC (1001), as explained. And 1011, the identifier, is a new concept that is being defined next.

Figure 11:
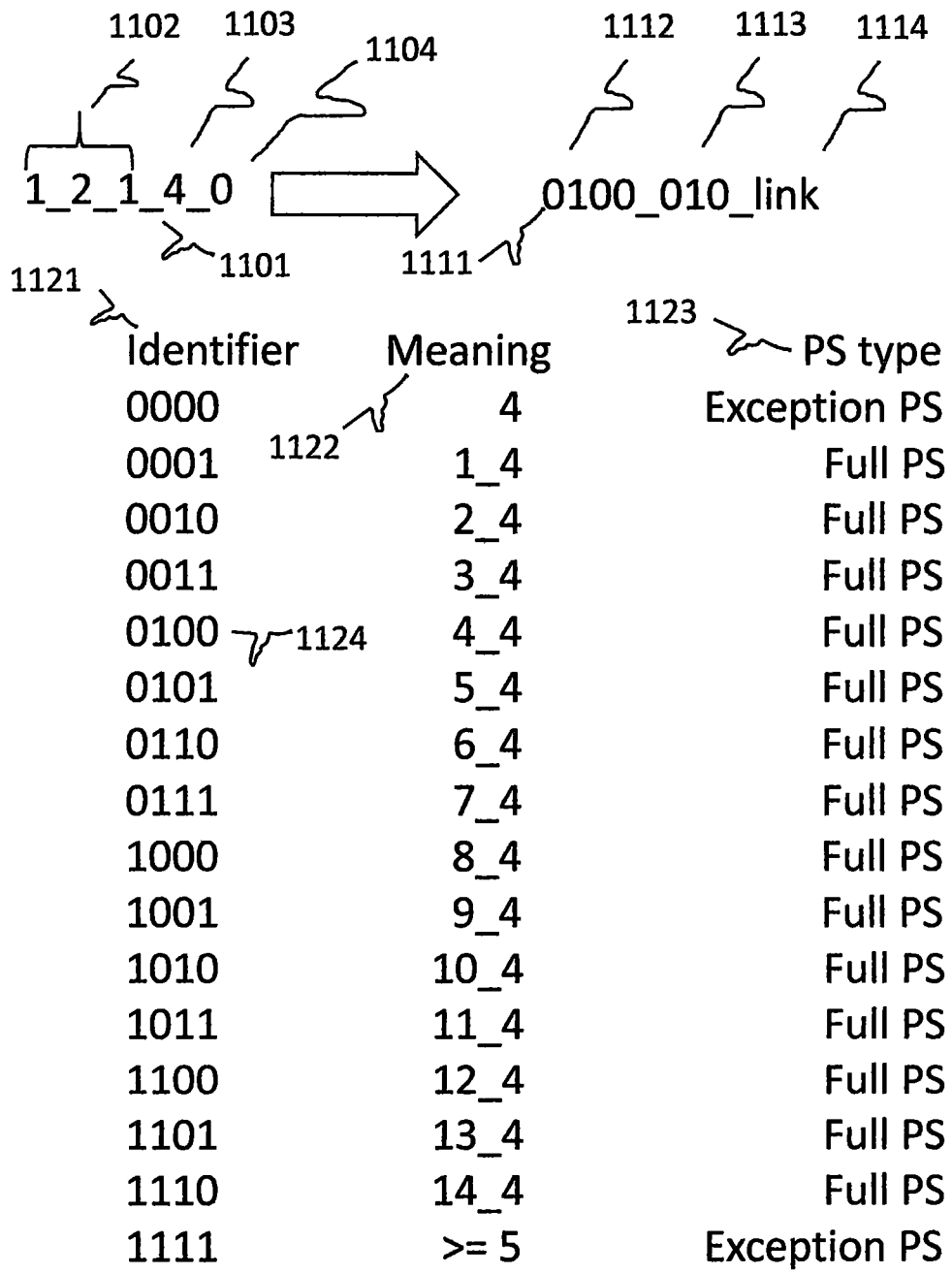
FIG. 11 is used to explain and exemplify the algorithm output and the unique correspondence to a given input, as used in one or more of the embodiments.

In order to explain this newly introduced identifier concept, FIG. 11 is being referred to.
In FIG. 11, 1101 represents the full PS, part of the IFDS, in the AB format. Note that the full PS has a core (ICAC) of Sum4, where the actual AB configuration is 121 (1102). With the four bit delimiter (1103), this full PS has 8 actual data bits. A link bit equal to 0 (1104) is considered.
In FIG. 11, 1111 is the corresponding output format of this full PS, output format as introduced and explained with reference to FIG. 10. As mentioned there, the output format consists of an identifier (1112), an ODC (1113) and the link bit (1114). As mentioned, the link bit 1114 is the same as the link bit 1104.

According to FIG. 8, for Sum4 (803), the ODC for the 121 ICAC, in column 804 is 010 (as noted at 1113). The identifier 1112, has four bits, and its absolute value is 0100 (as pointed by 1124 in FIG. 11).
Note that above, choices that are not properly introduced or explained are made. These choices refer to the identifier length of four bits, and the identifier absolute value of 0100. These choices are explained next.
As mentioned, the full PS 1101 has eight actual data bits.
For a compression gain equal to zero, the number of input data bits must be equal to the number of output data bits.
In the output data bits, the link bit is an integral part of the output, because if the link bit would not exist in the output, the actual value of the bits following a delimited would not be possible to be restored during decompression. The link bit specified in the format of the input full PS, is in fact determined for the output use.
Therefore, in the output, for the considered example, ODC plus the link bit account for four bits already. Accordingly, for compression gain to be equal to zero, the choice for the identifier must be four bits in length.
Another way to look at the choice of size 4 for the identifier, is that the identifier size is equal to the delimiter size (input-output correspondence therefore is that the delimiter size in the input equals to the identifier size in the output, and core (Sum) size in the input equals to (Sum-1) ODC size plus link bit in the output).
Therefore, the motivation of choosing the identifier length at four bits is clear. In order to explain the chosen absolute value, reference is being made to FIG. 11 again.
In FIG. 11, all 16 core identifiers used in the algorithm are listed in the 1121 column. Note that there are 16 core identifiers since the identifier has four bits.
The correspondence between the number of identifiers and the number of bits in the identifier is not required, but in the algorithm development, this maximum correspondence proves to be necessary in order to generate the maximum amount of remain configurations, as it will be shown.
However, if a person skilled in the art, as mentioned, chooses to develop a version of the algorithm with a delimiter size of six bits for example, and therefore possibly an identifier size of six bits, having 64 identifiers (maximum) may not be necessary.
The meaning of these 16 core identifiers is listed in column 1122, and for conformity, the type of input PS these identifiers correspond to is listed in column 1123.
Note for example, the identifier 1124, of value 0100 (same as 1111 in FIG. 11) represents a 4_4 class of full PS (Sum4 core), therefore this explains the choice of this absolute value for the 1111 identifier in FIG. 11.

At this point, based on the information included in the algorithm output, the full PS can be fully and uniquely restored during decompression (0100 identifier means a 4_4 class full input PS, where the core is 010 (i.e. a 121 AB format), and where the link to the next PS is 0 (i.e., there is one or more bits after this PS that are the same type as the delimiter). With the FB (not shown), the actual value of every bit in the input PS is also restored.
The core identifiers listed in FIG. 11, column 1121, represent the full list of core identifiers used in the algorithm. As described by columns 1122 and 1123, these identifiers cover all exception PS (4, 5, and greater same type bits) as well as all class 1_4 to 14_4 input full PS. As shown in FIG. 9 and commented above, out of all these classes that are covered by the algorithm, classes 4_4 to 14_4 do generate RODC configurations to be used in the algorithm for coverage of other constructs and for compression gain, as will be explained next.

As mentioned above, classes 4_4 to 14_4 generate RODC configurations that are used by the algorithm for coverage of other constructs and for compression gain. The next focus of this disclosure is to explain how these RODC configurations are used for the stated objective. In order to address this fundamental aspect, a close-up look at a real life data string is needed.

Such a real-life data string will have same type bit groups of 4, 5 and greater and 1_4 to 14_4 class input full PS, all covered, as described in FIG. 11 and FIG. 9, but the real life data string will also have any Sum larger than 14 (i.e. class x_4, with x larger than 14) and can also have an infinite string of bits (infinite for all practical considerations) without any four or larger same type bit (i.e. with only lower grade groups). The name that is used in this disclosure for such an infinite string of bits with only 1, 2, and 3 same type bit (lower grade) groups, is "open string".

All these (class x_4 with x greater than 14, and open string) are not covered based on what has been introduced up to now—without these being covered, the algorithm cannot work.

In order to resolve this problem, i.e. to cover the above described class x_4 and open string, the remain configurations (RODC) are used.

Before describing how RODC are used to cover the above stated constructs, a closer look at the Remain configurations is required.

According to FIG. 9, for Sum4 (class 4_4), one Remain configuration is made available. According to FIG. 11, for that configuration, identifier 0100 applies, and based on FIG. 8, configuration 111 is the available configuration. Therefore, the Remain configuration that is made available by the 4_4 class is 0100111 (a seven bit configuration).

A similar derivation can be made for the three Remain RODC from class 5_4. These three Remain configurations are 01011101, 01011110 and 01011111, therefore three eight bit configurations. Note that configurations 01011110 and 01011111 can be merged into a seven bit configuration 0101111. Therefore the class 5_4 makes available either three eight bit configurations, or one eight bit and one seven bit configuration.

On the same lines, an important point to make is with regard to class groups where the Remain number is the same order of magnitude as the Need number.

For example, if class 11_4 is considered (where Remain=520 and Need=504), it can be derived that this class makes available a five bit configuration together with an eleven bit configuration.

The five bit configuration for example is derived and shown to be 10111.

Of course, rather than having made available a five bit and an eleven bit configuration, it may be preferred to use 520 14 bit configurations (and that is perfectly equivalent).

The point made here is that such classes, where the remain number is in the same order of magnitude as the need number, provide a wide range of RODC. Similar discussions can be made for all available configurations, of all classes.

To understand how these Remain configurations are used to achieve the above stated objective, the configuration made available by class 4_4 will be used for the discussion. The reason why this is chosen is because this is the most straightforward example and easiest to follow. This discussion then can be similarly extended to any and all Remain configurations.

The Remain configuration made available by class 4_4 is, as derived above, 0100111, a seven bit configuration.

This seven bit configuration of class 4_4 can cover 2 configurations of class 5_4, 4 configurations of class 6_4, etc.—for every consecutive class increase a factor of 2 increase in coverage is noted.

For example, the named class 4_4 Remain configuration has the power to cover $2^{10}$ (1024) configurations in class 14_4, or $2^{16}$ (65536) configurations in class 20_4. This number, 65536, is called 20_4 Worth of one 4_4 Remain configuration.

In FIG. 9, column 905 is called Worth and is referring to this aspect. Clearly the Worth column can be filled relative to which class is being targeted by the Remain configurations, using the principle just introduced and demonstrated.

Besides the Worth factor of a Remain configuration into a higher class, just defined above, another very important aspect must be noted with regard to the potential use of these Remain configurations.

This aspect is regarding the rate increase of a Remain configuration into a higher class, versus the rate increase of the Need configurations into that same respective higher class.

This aspect has been already discussed above, and it was shown that the rate increase of one Remain configuration is two between two consecutive classes, while the rate increase for Need is notably less than two between the same two consecutive classes.

This is yet another fundamental aspect for one or more of the embodiments developed in this disclosure. In order to benefit the most from this rate increase difference, high order classes must be exploited.

In order to fundament this statement, an example is considered. The class 4_4 remain configurations has a worth rate increase factor into class 14_4 of $2^{10}$ (1024), and a Need rate increase factor into the same class of 3136/7 (448), in other words, over ten classes, the power of one Remain configuration increases by a net factor of more than 2 over the Need.

These two considerations (the worth factor of Remain configurations, and the rate increase differences between Remain and Need) represent the basis of usage of Remain configurations coming from classes 4_4 to 14_4, in order to achieve the goals of full coverage of an arbitrary input data string (i.e. coverage of any x_4 class and coverage of an open string).

In FIG. 12, a list of all classes and constructs that are covered in order to achieve the full coverage of an arbitrary input data string are provided.

It must be noted that a person skilled in the art can improve the algorithm performances by covering up to higher order classes. The objective of the disclosure is achieved as presented here, allowing persons skilled in the art to develop versions and implementations to achieve multiple optimizations.

Returning to FIG. 12, note that there are four groups of constructs that are being covered by the algorithm, to achieve the stated algorithm objective:

a. 1201—groups of four and greater same type bits, will cover the Exception PS, as defined.

b. 1202—full PS of class 1_4 to 27_4. Class 1_4 to 14_4 are covered directly by the core identifiers, while class 15_4 to 27_4 are covered by the Remain configurations (RODC) of class 4_4 to 14_4
c. 1203—the required open data string (with no delimiter, i.e. consisting of only lower grade groups) is covered. A 28 bit open data string is covered here. This 28 bit open string is covered as three sub-classes: class 25_3, class 26_2, and class 27_1, where x_y translates in any ICAC in x, terminated by y same type bits. 1203 is also covered by the RODC.
d. 1204—a group of special classes to complete the gaps in coverage, as class 26_3, class 27_2, and class 27_3. For these classes, the above x_y definition applies. 1204 is also covered by the RODC. The need for these so called gap classes will be explained next.

As defined, Exception PS (1201) do not need a link bit. The full PS classes at 1202 require a link bit. While necessary and highly beneficial, the link bit does introduce a disadvantage since it reduces by a factor of 2 the configurations that can be covered by that respective output class. For example, the 4_4 class has a four bit identifier, a three bit ODC, and a one bit link. If the link bit would be eliminated in some way (such that the link bit is not required anymore), the ODC would be four bit in length resulting in the class covering 16 configurations instead of just 8, This is the motivation why 28 in 1203 (the open string) is broken down in class 25_3, class 26_2 and class 27_1, and why 1204 in FIG. 12 is added as class 26_3, class 27_2, and class 27_3. By doing this, the open string of 28 bits does not require a link bit, and neither any of the six classes in 1203 and 1204. Not needing the link bit, all these classes pack double the configurations using half the Remain configurations. More insight into this is required, as follows:

25_3 does not require a link bit because after the group of three bits the bit type must change, otherwise 25_4 would be considered instead of 25_3

26_2 would require a link bit, but by introducing 26_3, it fills the gap to 26_4, and at that point neither 26_2 nor 26_3 will require a link bit anymore.

Same logic is applied for 27_1. Here, two classes are introduced to fill the gap to 27_4 (i.e. 27_2 and 27_3).

Finally, to conclude the above discussion, note that at this point, with the classes outlined in FIG. 12, any arbitrary string is covered by the algorithm.

It is time to introduce the format of a termination PS:

As described, the largest class, in term of bit length, is class 27_4. That is a 31 bit PS.

A termination PS is defined as a string of data, 31 bits or less in length, representing the last bits before the end of an IFDS.

In other words, the last 31 bits or less of an IFDS are not processed through the normal algorithm procedure as described above, no matter what these last 31 bits or less contain, including if these bits contain a full PS of any class that fits in the 31 bit space, an open string (a 28), or 31 bits of same type (an exception PS). The following need to be clarified:
a. If any class, as specified in FIG. 12, starts before the 31$^{st}$ bit from last and extends into the last 31 bits of the IFDS, it is processed normally.
b. Anything within the last 31 bits of the IFDS, even if it is a class that would start and complete before the IFDS ends, is processed differently.

This different processing named above at b. is introduced with respect to FIG. 13.

Since in the termination PS there is no restriction such as that imposed by the delimiter so that in the core there are only groups of lower grade, the termination PS can contain groups of any number of same type bits, from 1 to 31 (the maximum termination PS size).

In FIG. 13, there are two columns: 1301 lists all possible same type bit groups (1, 2, ... N ... 31, with N smaller than 31), and 1302 describes the representation for each such group (0 for 1 same type bit group, and (N−1) 1 s followed by a 0 for a group of N type bits, as shown by 1303 and 1304, and exemplified by 1305 and 1306 for the 31 bit case). All the bits in the termination PS will be written according to the representation shown in FIG. 13 in the algorithm output.

In addition, the last 0 from the representation of the bits of the termination PS in the algorithm output can be dropped, since that last 0 is self understood, therefore redundant. Dropping this last 0 will provide an extra gain of 1, so, the termination PS always provides a gain of 1.

A gain of 1 is also noted if the IFDS ends in a 27_4 class that starts with bit 32 from last, the gain of 1 coming from dropping the link bit of the 27_4 class (which becomes unnecessary, since there is nothing coming after the last bit in this 27_4 class).

This concludes the basic implementation of the algorithm,

The following immediate extensions of the basic implementation of the algorithm can be made. There are four extensions detailed below. All extensions do not interfere with the basic compression algorithm just presented. These extensions simply use the output of the basic compression algorithm to obtain additional gain.

2. When fifteen PS in a row occur, where these fifteen PS are either exception PS (four or more same type bits) or of class 1_4 to 6_4, a remain configuration of eleven bits is used as an identifier to signal this special situation. In this special situation, since it is known that for the next fifteen PS, there will be only eight types of PS, only eight identifiers will be needed, and at the same time the remain configurations from classes 4_4, 5_4, and 6_4 will be internally redistributed among these. All the above will lead to a gain of one for all configurations within this suite, and for some configurations within this suite will lead to a gain of 2. The overall compression performance for this situation becomes:

At least a gain of 4 to a maximum of a gain of 19, for the entire fifteen PS sequence, function of content (i.e. which configurations are in the fifteen PS sequence)

Note: In order to implement this extension of the algorithm, counting and tracking of PS types and class is required over fifteen PS. If within these fifteen PS there is a PS of class 7_4 or larger, the counting and tracking is restarted from that 7_4 or larger occurrence. This extension occurs when all fifteen PS are exception PS and full PS up to class 6_4, otherwise the output data is left untouched as it came out from the basic implementation of the algorithm.

3. When twenty PS in a row occur, where these twenty PS are either exception PS (four or more same type bits) or of class 1_4 to 14_4, a remain configuration of eleven bits is used as an identifier to signal this special situation. In this special situation, since it is known that for the next twenty input PS, there will be only fifteen types of input PS, the identifiers are reassigned, and at the same time the remain configurations from classes 4_4 to 14_4 will be internally redistributed among these. All the above will lead to an average gain of one for more than 50% of the configurations within this suite. The highest impact, and that is when this extension should be entered, is when most of the twenty PS are of class 7_4 to 14_4 (note that this extension is designed not to overlap extension 2). When class 1_4 to 7_4 dominate for this extension, the gain can drop to slightly more than 30% of all configurations within this suite to be of gain 1. The overall compression performance for this situation becomes:

A gain of 1 to a maximum of gain of 9, for the entire twenty PS sequence, function of content (which configurations are in the twenty PS sequence). It is possible not to achieve a gain of 1, again, function of content, even if there are twenty PS sequence are exception PS and class 1_4 to 14_4. If a gain of minimum 1 is not achieved, the extension is simply not activated, and the compressed output data is left untouched as it came out from the basic implementation of the algorithm.

Note: In order to implement this extension of the algorithm, counting and tracking of PS types and class is required over twenty PS. For this extension, tracking the overall gain is also required. If within these twenty PS there is a PS of class 15_4 or larger, the counting and tracking is restarted from that 15_4 or larger occurrence. The extension occurs when all twenty PS are exception PS and full PS up to class 14_4, otherwise the output data is left untouched as it came out from the basic implementation of the algorithm. The extension is not activated when the overall gain is not at least 1.

4. When twenty-five PS in a row occur, where these twenty-five PS are either exception PS (four or more same type bits) or of class 1_4 to 24_4, a remain configuration of eleven bits is used as an identifier to signal this special situation. In this special situation, since it is known that for the next twenty-five input PS, there will be a reduced set of input PS, the identifiers are reassigned, and at the same time the remain configurations from classes 4_4 to 24_4 will be internally redistributed among these. All the above will lead to an average gain of one for about 90% of the configurations within this suite. The highest impact, and that is when this extension should be entered, is when most of the twenty-five PS are of class 15_4 to 24_4 (note that this is designed not to overlap extension 2 or extension 3). When classes less than 15_4 dominate for this extension, the gain can drop to slightly more than 35% of all configurations within this suite to be of Gain 1. The overall compression performance for this situation becomes:

A gain of 1 to a maximum of gain of 14, for the entire twenty-five PS sequence, function of content (which configurations are in the twenty-five PS sequence). It is possible not to achieve a gain of 1, again, function of content, even if there are twenty-five PS sequence of exception PS and class 1_4 to 24_4. If a gain of minimum 1 is not achieved, the extension is simply not activated, and the compressed output data is left untouched as it came out from the basic implementation of the algorithm.

Note: In order to implement this extension of the algorithm, counting and tracking of PS types and class is required over twenty-five PS. For this extension, tracking the overall gain is also required. If within these twenty-five PS there is a PS of class 24_4 or larger, the counting and tracking is restarted. The extension occurs when all twenty-five PS are exception PS and full PS up to class 24_4, otherwise the output data is left untouched as it came out from the basic implementation of the algorithm. The extension is not activated when the overall gain is not at least 1.

Extensions 2, 3, and 4 are mutually exclusive in this order.

A key final improvement within this disclosure is introduced next, improvement that is used for one or more additional embodiments of this disclosure. This improvement insures further additional compression gain. The improvement uses un-altered output of the basic implementation of the algorithm and of any of the extensions one to four presented above, so, this improvement does not interfere or alter in any way the process presented up to now, including the basic processing and all the four extensions. This improvement is simply an addition to the algorithm, to insure additional gain.

This improvement works as follows.

To introduce and describe this improvement very clearly, two new concepts are being introduced.

The first concept is the concept of well defined identifier, and the second concept is the concept of root identifier.

In order to understand the concepts of "well defined identifiers" and "root identifiers", reference to FIG. 14 is being made, where, again, class 4_4 is used as an example and basis for discussion. This example discussion is similarly extended to any identifier, configuration, and class.

With respect to FIG. 14:

1401 is an index, 1402 lists the classes considered for this discussion, 1403 lists the ICAC considered for this discussion, 1404 lists the applicable core identifiers used in the algorithm output, and 1405 lists the applicable ODC written in the algorithm output.

The focus class is 4_4, which has seven ICAC, and uses the core identifier 0100. A very important observation is that class 27_4 uses the core identifier 0100 as well.

For class 4_4, the correspondence ICAC to ODC is listed on lines 1 to 7 of index 1401.

The combination of core identifier and corresponding ODC create the "well defined identifiers". Class 4_4 has therefore seven well defined identifiers that uniquely correspond to the seven ICAC. For example, the well defined identifier 0100010 corresponds to the ICAC 121 of class 4_4.

It becomes apparent that the well defined identifiers represent nothing else but the full description of the combination used by the algorithm to describe every input PS. While the well defined identifiers represent an integral part of the algorithm, and are required for the algorithm to function, a very limited number of identifiers need to be defined with the simple goal to define a class in as little identifiers as possible. The core identifiers cannot be used for this scope, because same core identifier is typically used by more than one class—0100 for example is used by class 4_4 and class 28_4.

Therefore, the concept of root identifier is introduced:

A root identifier represents the minimum common root to describe a group of well defined identifiers within a single class only.

To understand this definition for the root identifier, class 4_4 is being referred to again.

As described above, class 4_4 consists of seven well defined identifiers. According to FIG. 14, the minimum root that is common to all these seven well defined identifiers is the core identifier, 0100. But the core identifier cannot be used as a root identifier, since the core identifier is also used for class 28_4.

In order to determine the root identifier(s) for class 4_4, the focus must be placed on how can class 4_4 only be described. The only way to distribute 7 configurations (or 7 ODC) is 4 plus 2 plus 1, therefore for class 4_4, there will be three root identifiers, which are represented by groups 1406, 1407, respectively 1408, as shown in FIG. 14.

According to FIG. 14 the minimum common root for these three groups are 01000, 010010, and 0100110, therefore a root identifier of five bits, a root identifier of six bits, and a root identifier of seven bits.

For class 27_4, since all ICAC of this class are covered by the remain configuration of class 4_4, the root identifier is directly this remain configuration. Therefore, the root identifier for class 27_4 is 0100111 (1409 in FIG. 14), i.e. the root identifier is of seven bits. It should be noted that such a situation, where there is a single root identifier for an entire class, is rare. Typically, the root identifiers are distributed (as the case is for class 4_4).

Determining the root identifiers for all classes of this algorithm (all classes outlined in FIG. 12), is fundamental for this improvement. To describe the principle on how this improvement works, it is sufficient to list the root identifiers in term of how many bits they have. In this disclosure, a root identifier that is N bits long is called to be a root identifier of class N.

In FIG. 15, all root identifiers are listed, in term of how many bits they have.

Note that there are 13 types (or classes) of root identifiers for the entire algorithm (column 1501), where each type has a different bit length, from 4 bits in length to 16 bits in length (column 1502), i.e. root identifiers of class 4 to class 16.

There are multiple root identifiers in every class, as shown in FIG. 15, column 1503. Column 1503 represents the original list of root identifiers for every class, where each root identifier meets the definition (see above).

Column 1504 is the redistribution of these root identifiers for optimizations in the algorithm, where the optimizations follow mathematical conditions to optimize gain, as will be referred to next.

Column 1503 and 1504 are perfectly equivalent, with the following transformations to be noted:

One root identifier of class 4 (1505) is transformed in one root identifier each of class 5, 6, 7, 8, 9, and two root identifiers of class 10.

Eighteen root identifiers of class 7 (1506) are transformed in 36 root identifiers of class 8

One root identifier of class 9 (1507) are transformed in four root identifiers of class 11

The root identifier transformation from column 1503 to column 1504 needs to be clarified:

Taking class 4_4 of full PS as an example again, where there were three root identifiers, one of each 5 bits, 6 bits, and 7 bits (see above) i.e. one each of class 5, 6, and 7, the above transformation means nothing else but to say that class 4_4 has one root identifier of class 6 and five root identifiers of class 7, or seven root identifiers of class 7, which both are perfectly equivalent to the initial class 5, 6, 7 distribution.

It can be seen that any transformation of root identifiers can be made, as long as it makes sense practically, meaning that one cannot transform class 7 root identifiers from PS class 4_4 in class 8 or larger because there are not so many bits in an original class 4_4 PS, so, such transformation has no practical basis, it does not make sense.

Many optimizations to achieve improved algorithm performances can be made by a person skilled in the art, and again, the examples offered in this disclosure have the goal to fundament the disclosure and provides the means for a person skilled in the art, and these examples do not limit in any way the disclosure.

Figure 16:
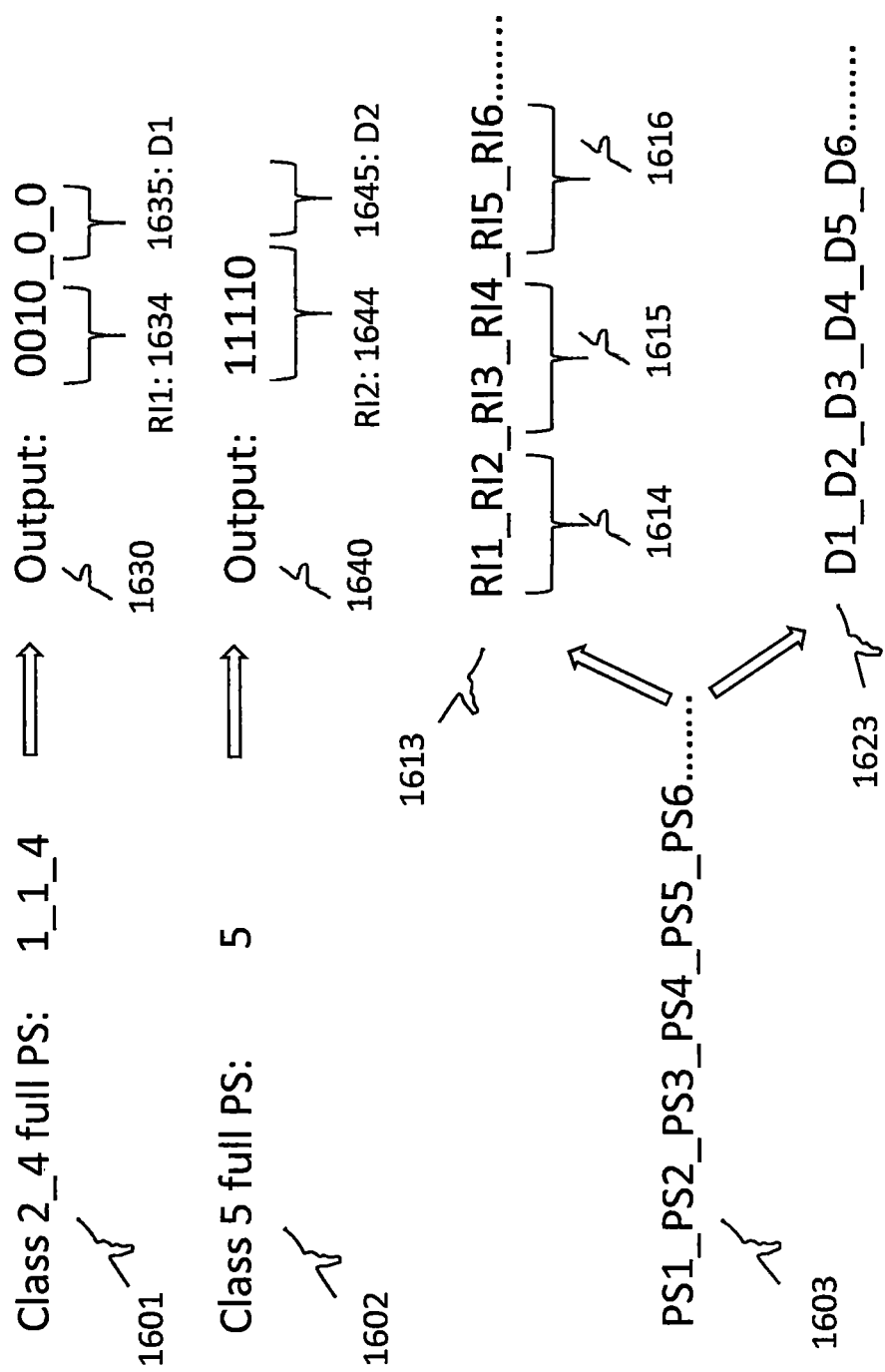

These root identifiers, as mentioned, are found already in the output of the algorithm, after the basic and extensions processing. FIG. 16 exemplifies this in order to introduce the next steps in processing the root identifiers to achieve the goals of the improvement that is presented here. Class 2_4 of full PS, and class 5 of exception PS are used for this discussion, with reference to FIG. 16.

In FIG. 16, 1601 is the first PS used in this example, a full PS.

The algorithm output of this full PS is shown, as 1630, where 0010 is the identifier for class 2_4, the following 0 represents the ODC for 1_1 ICAC of class 2_4, and the 0 to follow after that is the link bit.

1602 is the second PS used in this example, an exception PS. The algorithm output of this exception PS is shown as 1640, where 11110 is the identifier (five same type bits). Exception PS, as described above, does not have a link bit or an ODC.

Normally, after the basic and extension processing, the algorithm output is written serially, as shown at 1603, where six PS are shown as an example, followed by many others (the dots).

This improvement requires that the algorithm output is not written as a single output string 1603 anymore, but as two separate related strings, one containing the root identifiers (1613), and one containing the so-called "details" (1623). The two outputs (root identifiers and details), put together, do not represent anything else but the original algorithm output.

For example, 1630 consists of 1634 (called RI1, for root identifier of PS1, of value 0010) and 1635 (called D1, details of PS1, of value 00, which are all the remaining bits of 1630 after the root identifier is removed).

For 1640, similarly, RI2 is of value 11110 and there are no details for this PS (that is OK to have no details, and consider everything as root identifiers, and that is the case for 5 to 10 same type bit exception PS only—a five bit exception PS is chosen for this example to make the point).

Once 1613 and 1623 are assembled, obviously the original algorithm output is restored by reading first 1613, and based on what root identifiers are there, it is know how many bits to extract from 1623 for each root identifier (for example, extracts two bits for root identifier 0010, and zero bits for root identifier 11110).

When an extension identifier occurs (such as an open string 28 for extension 1, or the 11 bit identifiers for extensions 2, 3, or 4) this full extension identifier is placed in the 1613 part of the output, while all the output data for the constituent PS of the exception (such 25 PS for extension 4) are written in 1623.

Now, with 1623, nothing is done further for this improvement. The additional processing that is being done further for this improvement is for 1613 (the root identifiers partition). From the point of view of the above named processing of the root identifiers, there are several steps, as follows:
1. The root identifiers are paired, as shown by 1614, 1615, 1616.
2. The formed pairs are described based on their classes. For example, RI1 is of class 4 (four bits root identifier), and RI5 is of class 5 (five bits). According to column 1504, there are 32 combinations (4 times 8) to describe the class4-class5 pair.
   a, That is exactly what this improvement is doing, for every possible pair (there are 13 classes times 13 classes, therefore 169 possible pairs, each pair with a different number of combinations according to column 1504 in FIG. 15).

Figure 17:
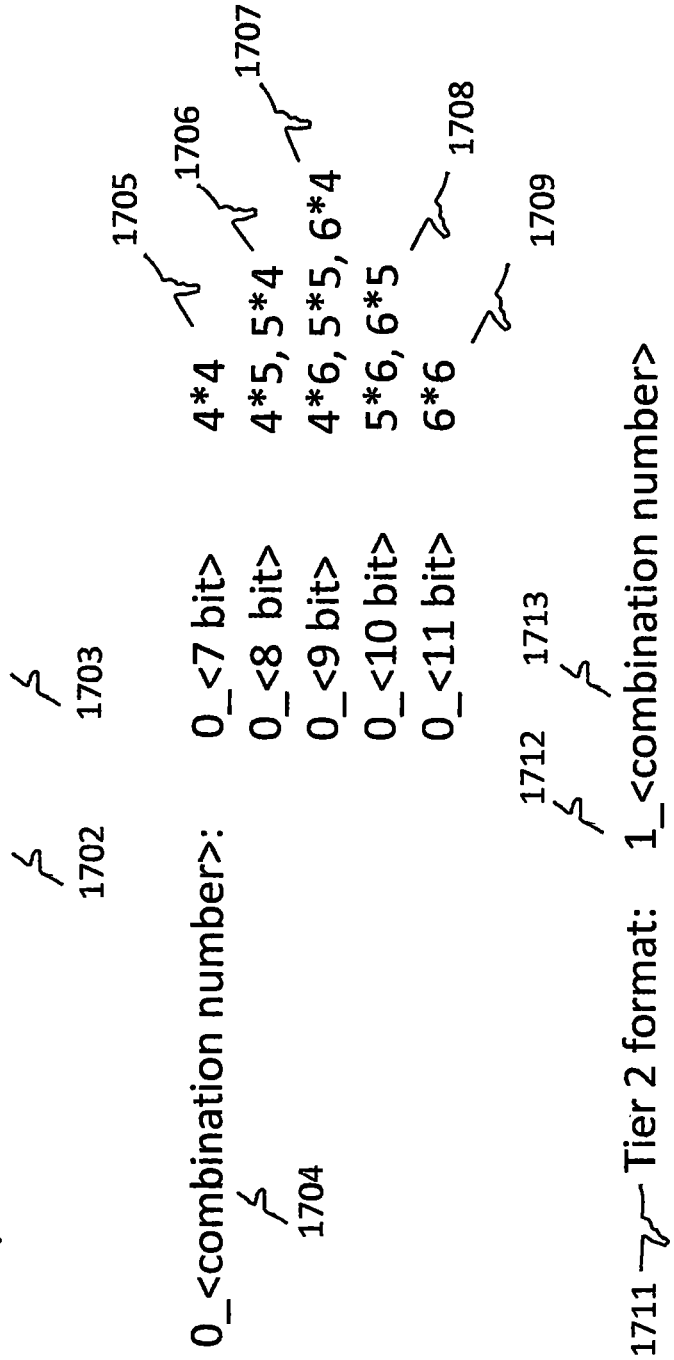
FIG. 17 illustrates how the root identifiers are used in the algorithm, in accordance to one or more of the embodiments

In term of implementation details of step 2 above, there are two tiers:
i. Tier 1: Combinations of two of root identifiers of class 4, 5, and 6
   The output of such combinations has the format shown in FIG. 17 as 1701.
   At 1705, 4*4 means combinations of root identifiers of 4 bits, with root identifiers of 4 bits (i.e. class 4 with class 4). Since there are four root identifiers of class 4 according to FIG. 15 column 1504, it means that there are 16 such combinations possible.
   Note at 1706, FIG. 17, that the output format to describe such combinations is 0_<7 bit> (i.e. 0 followed by 7 bit number). Since in a 7 bit number there are 128 possibilities, and only 16 possibilities are needed, it means that there are 112 possibilities remaining.
   These 112 possibilities will be used by the next combination group, which is 1706 (combinations of root identifiers of class 4, with class 5, and of course class 5 with class 4). According to FIG. 15 column 1504, there are 64 total such combinations.
   There were 112 times 2 available possibilities (times 2 because the 112 are transferred from 7 bit to 8 bit basis), means that there will be 160 (112*2−64) possibilities left to be transferred to the 1707 group, and so on.
   At the very end, a number of possibilities are left available, which are redistributed among the 1705 to 1709 groups. These redistributed possibilities create the gain combinations of every group, represented as a percentage of total combinations of that group. The tally of resulting gain combinations will be given at the completion of presenting this improvement.
ii. Tier 2 has the same principle and procedure at Tier 1. The output format is also the same, shown as 1711 in FIG. 17. The differences are;
   Sub-tier 2-1 (not shown, but explained here) resolves combinations between root identifiers of class 4, 5, or 6 and root identifiers of class 7 and greater
   Sub-tier 2-2 (not shown, but explained here) resolves combinations between root identifiers of class 7 and greater and root identifiers of all classes (from 4 to 16)
   The <combination_number> at 1711 in FIG. 17 is 10 bit long for combinations of classes 4*7 and 7*4, and up to and including 31 bit long for combinations of classes 16*16.

As a final note concerning the algorithm, the differentiating aspects are outlined when the RB (relative bit) transformation is employed. As outlined when the RB transformation has been defined and exemplified in connection with FIG. 2, RB transformation fundamentally changes the structure of the IFDS. Consequently, the distribution of PS classes and ICAC configurations within a class and across the IFDS drastically changes. Accordingly, the output of the algorithm is fundamentally different.

Clearly, the classic approach when there are two different representations of the same input data is to perform a data analysis and determine which of the two representations generate better results. This would be one approach here as well. However, the current implementation of the algorithm does not feature any data analysis and this stance is extremely beneficial for hardware implementation, as it has been discussed and will be further shown next in the hardware section. Therefore, in order to benefit from having two very different representations of the input data and therefore possibly two very different outcomes in term of compression gain, while preserving this great benefit of requiring no data analysis, the following solution is outlined:
a. Consider the two formats for the input data:
   i. The regular IFDS, and
   ii. The IFDS obtained after the RB transformation.
b. Run the two inputs through the algorithm. This can be done through two parallel chains of similar hardware (implementation 1), or by running the algorithm once for each data set (implementation 2). While theoretically, the first solution would suggest that double the hardware is necessary, and the second solution would suggest that the execution time will be double, none is completely true, since the first solution can be additionally pipelined and/or only certain sections parallelized, while the second solution can similarly benefit from pipelining. In any case, a hardware penalty will be predominantly visible for implementation 1, and an execution time penalty will be predominantly visible for implementation 2, but for neither will be double.
c. Once the two algorithm outputs are generated, the output with the highest compression gain will be chosen.

As mentioned in the summary section, the compression process can be repeated using as new IFDS the output of the just completed cycle. Unlimited number of cycles can be processed for unlimited compression, the only theoretical limit being that an IFDS cannot be smaller than a practical limit of about 1000 bits. When implementing such a multi-cycle compression, the only addition is a header where a counter keeps track of the number of executed cycles, so that the decompression is processed accordingly. The above quoted number of 1000 bits results from the extensions primarily, from the headers (such as the mentioned counter), and of course the need to provide statistical variability of PS and classes. This is a theoretical limit, practically, having IFDS smaller than 1M order is not really justified. The decompression is perfectly mirrored to the compression process, leading to an identical restored file to the initial IFDS, which was the input to the first cycle.

In the remaining of this disclosure, the suggested hardware implementation is described. Similar to the algorithm, it should be noted that the suggested hardware implementation is by example, and is in no way limiting, and the skilled person will appreciate that the disclosed implementation is equally applicable to multiple variations and alternatives, and multiple optimizations are possible to increase the performance metrics of the hardware, such as the execution speed or the hardware complexity. It must also be noted that the suggested hardware implementation is described at a high level, outlining key steps, therefore the low level details, which are not relevant for the substance and objective of this disclosure, may be not addressed.

Figure 18:
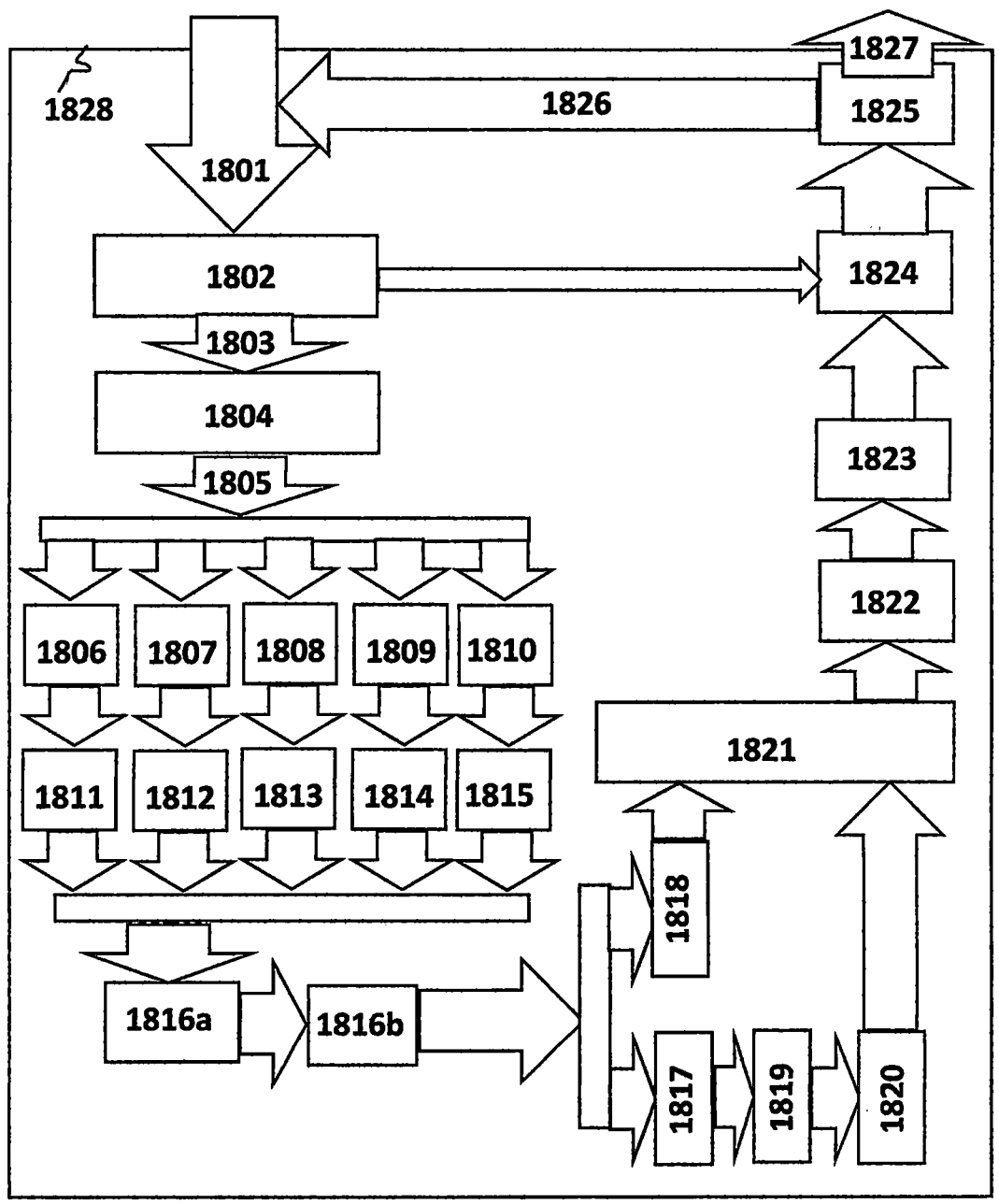
FIG. 18 is used to introduce, describe, and illustrate the architecture and hardware implementation of a compression chip, in accordance to one or more of the embodiments

The suggested hardware implementation architecture is a memory intensive pipelined architecture, as depicted in FIG. 18. The following hardware blocks and data-flow path constructs are outlined in FIG. 18:

a. 1801 represents the input data bus. This data bus is preferred to be 64 bits, but 32 bits is acceptable. This size of data bus is motivated since the maximum length of a PS is 32 bits and the $33^{rd}$ bit is needed to determine the link bit. A 32/64 bit data bus is no problem in any computer, audio, video based application. A 32 bit data bus may be preferred however for packaging constraints/cost.

b. 1802 is a small data buffer. The goal of this buffer is to stream the flow of data in case an input delay in receiving data occurs. The second goal of this buffer is to transform the data in a 64 bit data in case 1801 is of 32 bit. Having the data in 64 bit format is important for two reasons—to cover a PS in one step, and to determine the link bit, where applicable, in the same step.

c. 1803 is the new 64 bit data bus d. 1804 is a controller, implementing the following attributions:
  i. Determine the PS and class
  ii. If the PS is an exception PS with a number of same type bits greater than 32, create an output to indicate this.
  iii. Track and count the PS, as applicable, for basic algorithm, extension 1, extension 2, extension 3, and extension 4.

e. 1805 is the output of controller 1804, and contains the following:
  i. 33 bits with the PS that has been determined
  ii. 1 bit to indicate if the 33 bit above represents a full PS, or an exception PS with a number of same type bits greater than 32
  iii. Three bits for every of the four extensions, indicating:
    i. If current PS applies to subject extension that the three bits describe. For extensions 2, 3, 4, if current PS does not apply to that respective extension, the tracking for that extension is restarted. For example, for extension 2, the current PS is a class 8_4, therefore it does not apply to extension 2, and consequently, the tracking for extension 2 is restarted (see the details at extension 2 description).
    ii. If with the current PS, the extension is completed and the output can be written. For example, for extension 2, if the current PS completes the required 15 PS sequence, the flag is activated and the output for extension 2 is generated.
    iii. If none of the extensions complete or are all restarted, the previous PS are written as regular basic output. This is self-explanatory, if none of the extensions meet the conditions, the output is written as basic output.

f. 1806 is the memory to generate output from PS input for basic algorithm. The size of this memory is 68M of 32 bit words. The PS is the address to this memory.

g. 1807 is the memory to generate output from PS input for exception 1. The size of this memory is 68M of 32 bit words. The PS is the address to this memory.

h. 1808 is the memory to generate output from PS input for exception 2. The size of this memory is 1k of 32 bit words. The PS is the address to this memory.

i. 1809 is the memory to generate output from PS input for exception 3. The size of this memory is 8k of 32 bit words. The PS is the address to this memory.

j. 1810 is the memory to generate output from PS input for exception 4. The size of this memory is 2.5M of 32 bit words. The PS is the address to this memory.

k. 1811 to 1815 are all the same, and are small, 32 location buffers of 32 bit each. These buffers accumulate the outputs of 1806, 1807, 1808, 1809, 1810 respectively until the decision by controller 1804 is made as which of the buffers are transmitted to the output (basic or one of the extensions).

l. 1816a is a controller that receives input from controller 1804.
  i. If controller 1804 sends to the output the PS as basic, controller 1816a does nothing, leaves data from 1811 as is.
  ii. If controller 1804 sends to the output the PS as extension 1, the PS is obviously coming after a 28, and the controller 1816a does nothing, leaves data from 1812 as is.
  iii. If controller 1804 sends to the output the PS as extension 2, controller 1816a inserts a PS which is the 11 bit identifier used for exception 2. Then sends the 15 PS generated for exception 2, from 1813.
  iv. If controller 1804 sends to the output the PS as extension 3, controller 1816a inserts a PS which is the 11 bit identifier used for exception 3. Then sends the 20 PS generated for exception 3, from 1814.
  v. If controller 1804 sends to the output the PS as extension 4, controller 1816a inserts a PS which is the 11 bit identifier used for exception 4. Then sends the 25 PS generated for exception 4, from 1815.

m. 1816b is the memory to extract and separate the root identifier and the details parts of every PS output. Memory size is 68M of 32 bits. The PS output is the address to this memory. For extension 1, the memory will detect the open string (the trigger for extension 1), separate the open string in root identifier and details, and place the next output in the details partition. For extensions 2, 3, and 4, the memory will indicate that the root identifier is the actual respective 11 bit identifier which is the PS, and the details represent all the 15, 20, respectively 25 PS coming after the respective 11 bit identifier.

n. 1817 is a LIFO buffer of size 8×32 bits, to store last eight root identifiers.

o. 1818 is a LIFO buffer of size 33×32 bits, to store the last eight "details". 25 out of the 32 details are only used for extension 2, 3, and 4.

p. 1819 is a controller that will pair two by two root identifiers from the 1817 buffers, and create a 32 bit output.

q. 1820 is a memory that will generate the corresponding output to the root identifier pair that is the address to this memory. The size of this memory is 32k of 32 bit words.

r. 1821 is a controller that will assemble the output of the root identifier pair from 1820, with the corresponding details parts from 1818 that were corresponding to the root identifiers in the pair. The size of the 1821 output is 96 bit wide (32 bit for the root identifier pair, and 32 bit each for the details part corresponding to each root identifier). Note that for the extensions, the details can be spread over 5, 7, or 9 96 bit words. Without the extensions, the 96 bit size is a maximum size for root identifier pair and details (minimum size is 10 bits— root identifier pair can be minimum 8 bits, and the details can be even zero bits).

s. 1822 is a buffer, of 10 locations, 96 bit wide each. 10 locations can cover any extension.

t. 1823 is a controller that will take every 96 bit output and will extract just the used bits, based on the root identifier and corresponding detail content. These extracted used bits can have a wide range of bit lengths, from eight bits, up to 90 bits. Then the controller will append this extracted data to an output string. This output string is 192 bits wide.

u. 1824 is a controller that will parse the data in 64 bit wide format from the 192 bit wide output string generated by 1823. 1824 will also extract the FB of the IFDS, and prepare and update the headers such as the counter for the number of cycles when the IFDS is compressed multiple times, as mentioned.

v. 1825 is the 64 bit word memory that stores the algorithm compressed data. The size of this memory depends on the application. A suggested size for this memory is 100M of 64 bit words, which would cover input files (IFDS) up to about 6 Gbits. For files larger than that, the compressed data will be written in an external memory.

w. 1826 is the internal 64 bit data bus going back to block 1802, this data bus being used during the multi-cycle compression, as described above. This internal bus will be used primarily when the input files are smaller than 6 Gbits—for input files greater than that, the input data for the subsequent compression cycles will be read from the external output memory.

x. 1827 is the 64 bit data bus for chip output, to out the compressed data either for the external memory in case of input files greater than 6 Gbits, or for external uses, such as for wired and wireless transmission between users, storage, communication, etc.

y. Finally, 1828, the border, signifies the entire chip.

Note the fully serial flow of data within the chip—the ideal case for a pipelined implementation. In fact, as presented above, the flow of data is already pipelined (registers are present at every block—1802, 1804, 1806 and all on that level, 1811 and all on that level, 1816, 1817, 1818, 1819, 1820, 1821, 1822, 1823, 1824, 1825.

As mentioned at the start of this hardware section, this suggested hardware implementation architecture is a memory intensive pipelined architecture. The pipelined part of the proposed architecture is clarified. The memory intensive part refers to the fact that major blocks are represented by memory (such as 1806, 1807, 1808, 1809, 1810, 1816, 1820, and 1825). This memory is of two types:

Functional memory, required by the algorithm to operate. This memory is represented by blocks 1806, 1807, 1808, 1809, 1810, 1816*b*, and 1820. The total size of this memory is about 210M of 32 bit.

Data memory, require to write algorithm output. This memory is represented by block 1825. As mentioned, the size of this memory depends on the application, with a suggested size of 100M of 64 bit.

The chip memory internal requirements seem large for today's capabilities, but doable. High speed internal and external memory architectures are to be employed for the implementation—this is not the object of this disclosure.

Obviously, all this memory can be external to the chip. In this version of chip implementation, where most of the memory is external, the chip architecture is altered by means of additional external data and address busses (one or more, depending on the speed of data throughput desired from the chip).

Several versions are possible, that are apparent to a person skilled in digital design. By having external memory, there will be a penalty in the chip data throughput, in the best case of just an increased memory access time, and in the worst case of multiplexing and serializing the access to the output memory.

Two extreme examples are provided as two implementation options of having the memory external to the chip:

Example 1 is when all external memory banks have their own dedicated busses.

Blocks 1806 and 1807. These will require an extra 33 bit address bus and an extra 32 bit data bus.

Block 1816*b*. This will require an extra 32 bit address bus and an extra 32 bit data bus Block 1825. The data bus already exists for this (1827 and 1801), and an address bus is not needed, because data is written or read serially in a LIFO fashion. Only a controller is needed for this.

This implementation will require a chip package of about 250 pins. The actual remaining silicon chip is fairly small (just the controllers and some small memory), and is I/O dominated. In term of throughput, this is not affected as compared to the initial proposed all-included architecture, rather than an increased memory access time.

Example 2 is when the memory is in two banks, one functional and one output, and the access to the functional memory is all multiplexed.

Blocks 1806, 1807, and 1816*b* will require a 34 bit address and 32 bit data bus.

This arrangement will produce a savings in pins of about 70 pins, so the package pin requirement is dropped to about 180 pins, but the throughput is affected, since the memory access to perform the functions for 1806/1807 and 1816*b* need to be serialized.

Figure 19:
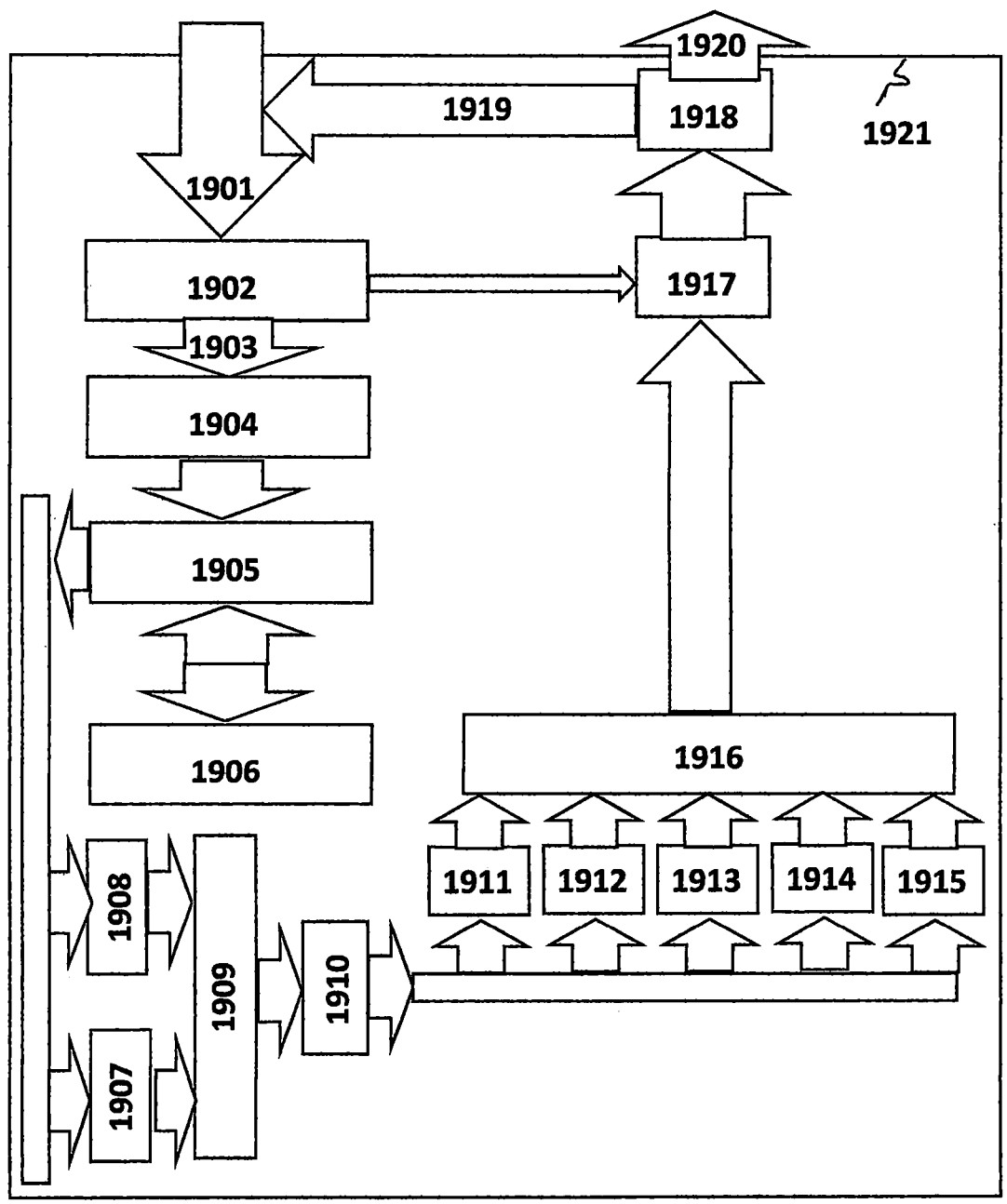
FIG. 19 is used to introduce, describe, and illustrate the architecture and hardware implementation of a decompression chip, matching the compression chip, in accordance to one or more of the embodiments

For decompression, a different chip is required. The controllers are different, and the memory content for the functional memory is different. FIG. 19 describes the architecture for the decompression chip. Similar as for FIG. 18, the following functional blocks are outlined:

a. 1901 represents the input data bus where the compressed data is received. This data bus is preferred to be 64 bits, because the compressed data is written in 64 bit format (see the compression chip above) but 32 bits is acceptable.

b. 1902 is a small data buffer. The goal of this buffer is to stream the flow of data in case an input delay in receiving data occurs. The second goal of this buffer is to transform the data in a 64 bit data in case 1901 is of 32 bit.

c. 1903 is the new 64 bit data bus d. 1904 is a controller, implementing the following attributions:

i. Extract the FB ii. Extract the headers, such as the counter indicating how many cycles occurred in generating the compressed data. The same number of cycles will be replicated during decompression.

iii. Transform the 64 bit format of the data into 192 bit wide words.

e. 1905 is a controller that disassembles the 192 bit words in words that represent processed root identifier pairs and the details of the two root identifiers that have been processed in pair. Since the processed root identifier pair has a wide range of bit length (from 8 to 32 bit in length) and the details part corresponding to each root identifier has also a wide variation (from zero bits to 32 bits, and more for the extensions 2, 3, 4), the complexity of this controller is notable, and to generate the disassembled output can be slow. To resolve this problem and to seamlessly generate the disassembled output fast, the following solution is proposed for this controller:

i. Controller takes 96 bits from the received 192 bit words, obtaining 96 bit words.

ii. Controller takes the first 32 bits of this 96 bit word. Clearly this 32 bit word will contain for sure the entire processed root identifier pair, but it may contain also full or part of the details of the two root identifiers, and more. All that is important is that it contains the processed root identifiers and these are the first bits in this string, from the most significant bit.

iii. Controller reverses this 32 bit word, i.e. the most significant bit becomes the least significant bit.

iv. This reversed 32 bit word becomes an address to a memory. The address will be 32 bit long, but the memory content will recognize just the addresses that are relevant. For example, if the address contains an eight bit word (starting from the least significant bit) that is relevant to represent a processed root identifier pair, since the eight bit word is unique. The rest of the 24 bit content in the address is ignored. In other words, a 32 bit word will generate a unique output from this memory (determining automatically which of the 32 bits are relevant for the memory, starting from the least significant bit).

v. The output of the memory will indicate:
  i. The two unprocessed root identifiers. Since the root identifiers are up to 16 bit long, the two root identifiers will be outputted from the memory as two 16 bit words.
  ii. How many bits in the 32 bit address were representing the processed root identifier. Since the processed root identifier pair is up to 32 bit long, this information is provided by the memory in five bits format. This information is used by the controller to eliminate these bits from the 96 bit word and know where the detail bits for the two root identifiers start in this string.
  iii. How many bits each root identifier has in the details part. Since each root identifier can have up to 32 bits in the detail part (without exception 2, 3, 4), and the three exceptions must be added, this information is outputted by the memory as six bits for each root identifier. This information is used by the controller to know how many bits to consider for the details of the two root identifiers from the 96 bit word. If any of the exceptions 2, 3, 4 have been flagged as present, then the controller will consider up to nine of the next 96 bit words for the details of this root identifier pair.
  iv. Therefore the output of the memory will be 16 bit for the first unprocessed root identifier, plus 16 bit for the second unprocessed root identifier, plus 5 bits for the number of bits for the processed root identifier pair in the 96 bit word, plus six bits each for the number of bits in the 96 bit word (or multiple of 96 bit words in case of extensions 2, 3, 4), representing the details part corresponding to each root identifier—total 49 bits.
  vi. The controller will process the 49 bit output of the memory by creating the two output PS by putting together each unprocessed root identifier and the corresponding details.
  vii. The controlled will eliminate the bits for the processed root identifiers and the bits for the two corresponding details of the root identifiers, from the 96 bit word (or multiple of 96 bit words for extensions 2, 3, 4), and therefore prepare the next 96 bit word for the next processing.

f. 1906 is the memory associated to controller 1905, as described above. The size of this memory is 32k of 49 bit words, and has a 32 bit word address.

g. 1907 is a buffer of 8 (33) locations in size and 32 bit words, containing the first output PS obtained from controller 1905 and memory 1906 as described above, from the root identifiers and details. 1907 will contain the first root identifier in the pair, therefore will contain the first output PS. It is obviously very important in the decompression to keep the order of the PS. The extra 25 locations (33-8) are only used in case of extensions 2, 3, 4.

h. 1908 is a buffer of 8 (33) locations in size and 32 bit words, containing the second output PS obtained from controller 1905 and memory 1906 as described above, from the root identifiers and details. 1908 will contain the second root identifier in the pair, therefore will contain the second output PS. It is obviously very important in the decompression to keep the order of the PS. The extra 25 locations (33-8) are only used in case of extensions 2, 3, 4.

i. 1909 is a straight-forward controller merging the output PS from 1907 and 1908 (i.e. putting them in order, second after first). A series of memory locations containing serial output PS, is formed. Now, what is left in order to restore the IFDS, is to transform this series of output PS in input PS.

j. 1910 is a controller that interprets the current PS coming from 1909. The controller is simply comparing this current PS with the identifier for extension 1 (the open string of class 28), or for extension 2, 3, 4 (the three 11 bit identifiers). If the comparison is true for extension 1, is sending the data to 1912, if the comparison is true for extension 2, is sending the data to 1913, if the comparison is true for extension 3, is sending the data to 1914, if the comparison is true for extension 4, is sending the data to 1915, and if the comparison is not true for the extensions, is sending the data to 1911. To compare the current PS with the identifier for extension 1, controller 1910 will require a memory of 15M of 32 bit words.

k. 1911 is a memory that transforms output PS in the corresponding input PS for basic. The size of this memory is 68M of 32 bit words, and is the reversal of 1806.

l. 1912 is a memory that transforms output PS in the corresponding input PS for extension 1. The size of this memory is 68M of 32 bit words, and is the reversal of 1807.

m. 1913 is a memory that transforms output PS in the corresponding input PS for extension 2. The size of this memory is 1k of 32 bit words, and is the reversal of 1808 n. 1914 is a memory that transforms output PS in the corresponding input PS for extension 3. The size of this memory is 8k of 32 bit words, and is the reversal of 1809
o. 1915 is a memory that transforms output PS in the corresponding input PS for extension 4. The size of this memory is 2.5M of 32 bit words, and is the reversal of 1810
p. 1916 is a buffer, of 64 locations of 32 bits, which takes the data as is generated from either of 1911, 1912, 1913, 1914, and 1915.
q. 1917 is a controller that uses the FB and headers extracted by 1902. If the headers indicate that this is the last decompression cycle, the real bit value in the PS from 1916 is restored. If this is not the last cycle, the counter for the number of cycles is decremented, and after the current decompression cycle completes, a new cycle is restarted.
r. 1918 is the memory data in which the uncompressed data is written. Similar considerations are outlined as for the 1825 data memory in the proposed compression chip. A 200M of 32 bit words size is suggested, for the same target of about 6 Gbit uncompressed final output, with a similar discussion for an off-chip data memory.
s. 1919 is the internal 64 bit data bus going back to block 1902, this data bus being used during the multi-cycle decompression, as described. Similarly as for the compression chip, this internal bus is primarily motivated when the data memory is internal.
t. 1920 is the 32 bit data bus for chip output, to out the uncompressed data for external uses, or for the external data memory when such used.
a. Finally, 1921, the border, signifies the entire chip Similar to the compression chip, the decompression chip features a fully serial flow of data within the chip as well—the ideal case for a pipelined implementation. For the decompression chip, similarly as for the compression chip, the flow of data is already pipelined. Also similarly, the decompression chip features functional memory and data memory. The functional memory is about 160M of 32 bit words (smaller than the functional memory in the compression chip, since the memory that extracts the rood identifiers and details from PS is not necessary in the decompression chip). The data memory is the same size as in the compression chip. The functional memory for the decompression chip consists of 1906, 1910, 1911, 1912, 1913, 1914, and 1915, while the data memory consists of 1918.

External memories to the chip can be used for the decompression chip as well, with the same discussions and potential penalties. The functional memory that is primarily preferred to be external is 1910, 1911, 1912, and 1915, with 1910 representing one functional bank and 1911, 1912, and 1915 representing the second functional bank, where the two banks need to be serialized in an implementation solution similar to solution at example 2 described at the compression chip. Estimated performances are similar as the compression chip.

To conclude, final remarks about the full disclosure, with the goal to outline possible attractive optimizations or modifications, are provided.

The embodiments discussed in this disclosure use delimiters of size four. Consequently, in the PS core, groups of same type bit smaller than the delimiter (i.e. smaller than four, i.e. groups of 1, 2, 3) are acceptable. Briefly, the discussion here targets to outline the consequences of focusing on a size larger than four and on a size smaller than four.

a. For a size larger than four:
  a. Consider a size five.
  b. Preliminary analysis shows that a size five may generate more gain, because the identifiers will be of size five, and much more remain configurations will be available. However, the main drawback is that the size of functional memory will increase to very large sizes. Accordingly, the general outline will be:
    i. The hardware complexity increases
    ii. The functional memory sizes in particular increases substantially
    iii. The gain once the processing is activated appropriately increases
    iv. The execution speed decreases since the hardware complexity and the processing is higher
b. For a size smaller than four
  a. Consider a size three
  b. Preliminary analysis shows that a size three may not be possible, because identifiers of size three are required, leading to not having sufficient classes to generate sufficient remain configurations. Just for conformity, considering that size three actually works (which, again, seems it does not), the general outline would be:
    i. The hardware complexity decreases, including the functional memory sizes in particular which decreases substantially. External functional memory would never be justified.
    ii. The processing is activated with increased probability as compared to size four, however, more cases are estimated to generate gain zero.
    iii. The execution speed increases since the hardware complexity and the processing is lower Concluding, changing the size has notable implications on all aspects and performances. While in some cases a larger or a smaller size can be beneficial, it is considered that for the embodiments as described in this disclosure size four is providing good trade-offs between gain, complexity, and execution speed. A person skilled in the field however can alter and re-engineer the embodiments of this disclosure to optimize the performances at a higher level for other sizing, or other types of delimiters. From the simple analysis provided above, a larger size (size five) is attractive for such investigations and optimizations.

Another possible attractive optimization or modification refers to an aspect discussed across this disclosure, respectively the RB transformation. The suggested hardware outlined in FIG. 18 and FIG. 19, can be altered by introducing a controller to perform this RB transformation and perform a double processing (one direct, as described in the hardware, and one using the RB transformed IFDS, and at the end choose the result that provides best gain. The additional hardware is negligible, but the theoretical processing speed is halved.

Yet another attractive optimizations, as briefly discussed in the disclosure, is to extend to use higher order Sum (higher order core). For example, an attractive Sum would be Sum36, where the Need configurations can be described with Sum-4 number of bits, i.e. the worth factor of remain RODC configurations greatly increases, That can be an attractive pursuit, with the note that the functional memory needs increase quite substantially, making a requirement to have all the functional memory as an external memory (at least at the current level of technology). Having the functional memory as an external memory is not an impediment, other than a possibly slower speed (with proper data-busses and adjusted chip architecture, as outlined above in the hardware section), so, this optimization is notably attractive.

Finally, another attractive optimization pursuit is a multi-chip parallel architecture. In such architecture, the chip will consists of the controllers only, largely as described. Multiple such chips (for example a 32 chip parallel architecture) will access external memory banks. The applications of such parallel architectures can be for example live compression, transmission, and decompression of raw high definition lossless video content, where the transmission medium requirements are even of the lowest available standards.

The applications of the chips and chip-sets outlined in this disclosure, based on the disclosed algorithm, are countless, advancing the current state of the art in communications, high definition and hi-fi video and audio transmission including cell-phone and social media, audio/video cameras, laptops/computers, internet, data storage applications, conferencing, etc., including:
- Integrated in the transceiver chain of a cell-phone, for the highest quality audio/video, social media communications, and related
- Integrated in a laptop wireless/wireline, for the highest quality video conferencing, data storage, communication between users, and related
- Integrated in appropriate devices for highest quality, reliability, storage capabilities, and other performances as a function of application, for multimedia applications, internet, high definition audio/video downloads, cloud computing, IoT (Internet of Things), ADAS, GPS, and related.

From reading the present disclosure, other variations and modifications will be apparent to the skilled person. Such variations and modifications may involve equivalent and other features which are already known in the art or are implied by the embodiments presented in this disclosure. Such variations and modifications may increase the performance of the algorithm, such as improve the processing speed or the gain. For example, modifying the sizing (as outlined above), or increasing the Sum order, or implement parallel processing paths for AB versus RB representations, and others suggested or not explicitly in this disclosure, will achieve such improvements. There are countless such variations and modifications possible as covered or derived by/from the embodiments of this disclosure, and a chip implementing the object of the disclosure can be designed to be reconfigurable, since one optimization, alteration, or modification may be useful in one application and may be skipped in another application—therefore one chip is to be available with variable settings function of the application.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

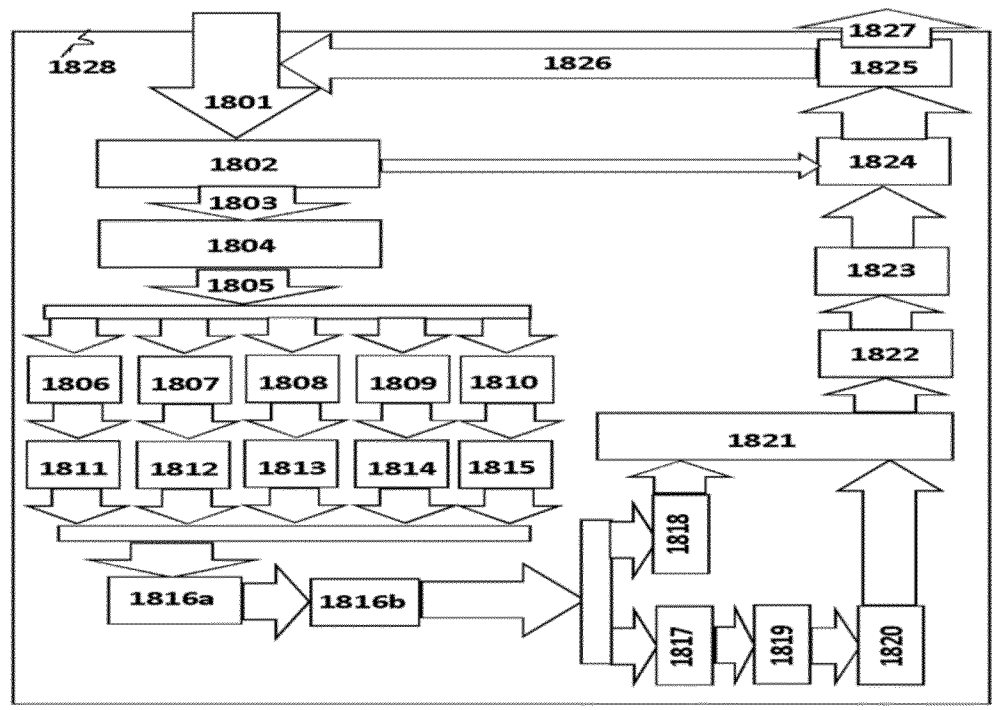

The invention claimed is:

1. A method to partition an arbitrary binary input data string (IFDS) into well-defined consecutive segments, comprising:
   (a) describing said IFDS into groups of bits of alternating same type bits, comprising:
       an arbitrary binary input data string (IFDS);
       wherein said IFDS is described in term of number of bits in consecutive groups of bits;
       wherein each of the said consecutive groups of bits are groups of bits where the bits are of same bit type as either 0 (0 logic) or 1 (1 logic);
       wherein said bit type in any two of said consecutive groups of bits are of the opposite type, or alternating from 0 to 1 or from 1 to 0;
       a first bit in the said string of bits is used as reference to determine the bit type in every of said consecutive groups of said alternating same type bits;
   (b) identifying in said described IFDS a group of bits of a preferred bit pattern, comprising:
       with respect to said preferred bit pattern, the rest of the bits in the said string of bits form groups characterized either by the same preferred bit pattern or by a different bit pattern;
       wherein the said different bit pattern is compared to the said preferred bit pattern as having a lower grade or a higher grade;
       the said lower grade represents any objective measure, such as represents a smaller (lower) binary number when compared to the binary number represented by the said preferred bit pattern, or a smaller (lower) number of binary 1 bits when compared to the number of binary 1 bits within the preferred bit pattern, or a smaller (lower) number of binary 0 bits when compared to the number of binary 0 bits within the said preferred bit pattern, or a smaller (lower) number of same type bits as compared to the number of same type bits in the said preferred bit pattern;
       the said higher grade represents any objective measure, such as represents a larger (higher) binary number when compared to the binary number represented by the said preferred bit pattern, or a larger (higher) number of binary 1 bits when compared to the number of binary 1 bits within the said preferred bit pattern, or a larger (higher) number of binary 0 bits when compared to the number of binary 0 bits within the said preferred bit pattern, or a larger (higher) number of same type bits as compared to the number of same type bits in the said preferred bit pattern;
   (c) classifying the bits in said described IFDS relative to said identified groups of preferred bit pattern, comprising:
       a first group of said preferred bit pattern or of said higher grade is detected in said IFDS wherein in-between the first bit in said IFDS and the first bit in said first group there are zero bits, meaning that the said first group is first in said IFDS;
       a second group of bits of said preferred bit pattern is detected in said IFDS wherein when the said first group does not exist, in-between the first bit in said IFDS and the first bit in said second group there is at least one bit, and when said first group exists, said second group follows said first group and in-between the last bit of said first group and first bit of said second group there is at least one bit;

a third group of bits of said preferred bit pattern or of said higher grade immediately follows the said second group, wherein said immediately means that in-between the last bit of said second group and the first bit of said third group there are zero bits and wherein the bits in said third group can be either of same or opposite bit type as the bits in the said second group;

a fourth group of said higher grade which follows said third group when in-between the last bit of said third group and first bit of said fourth group there is at least one bit, wherein said group of higher grade is divided into a group of said preferred bit pattern and a remain group, wherein if said remain group is a group of said lower grade is merged into the next group and if said remain group is a group of higher grade becomes a stand-alone group of the same classification as the third group;

a fifth group of said preferred bit pattern which follows the said remain group of said fourth group when if said remain group is a group of said lower grade, in-between the last bit of said remain group and first bit of said fifth group there can be zero or more bits of lower grade, and when if said remain group is a group of higher grade, in-between the last bit of said remain group and first bit of said fifth group there is at least one bit;

wherein at least one of the following pairs exist in said IFDS, as said first group and said second group, said first bit in said IFDS and said first group, said second group and said first bit in said IFDS and not said first group, said second group and said third group, said third group and said fourth group, said fourth group and said fifth group, and wherein according to these pairs, in-between said first group and said second group, or in-between said first bit in said IFDS and said second group, or in-between said second group and said first bit in said IFDS and not said first group, or in-between said third group and said fourth group, or in-between said remain group and said fifth group when said remain group is of said higher grade, or in-between said fourth group and said fifth group when said remain group is of said lower grade, there is one or more groups of said lower grade;

wherein summing all the bits for all groups of said lower grade that exist in-between one of said pairs, a number that is characteristic, or a characteristic number, is formed for the said groups of lower grade;

wherein only a set of said characteristic numbers are accepted for use, wherein said numbers are in-between one and a determined maximum characteristic number greater than one;

wherein when a said group of lower grade that exists in-between one of said pairs has a characteristic number greater than said maximum characteristic number, said group is divided into sub-groups wherein each such sub-group is characterized by a characteristic number belonging to a well defined sub-set of said accepted characteristic numbers;

wherein a said group of lower grade or a said sub-group characterized by the said sub-set of accepted characteristic numbers does not always terminate with a group of said preferred bit pattern;

(d) assembling said classified bits into well-defined consecutive segments, comprising:
(1) zero or one of said first group;
(2) one or more of said third group also known as exception group;
(3) one or more of said group characterized by a said accepted characteristic number terminated in a said preferred group, also known as first full group;
(4) one or more of said group characterized by a characteristic number belonging to a well defined sub-set of said accepted characteristic numbers that does not terminate with a group of said preferred bit pattern, also known as second full group.

2. The method, of claim 1, wherein step (a) is replaced with the following description, comprising:

an arbitrary binary input data string (IFDS) said IFDS is described in term of change in-between two consecutive bits, with said change being either constant from bit-to-bit (0-to-0 or 1-to-1), or opposite from bit-to-bit (0-to-1 or 1-to-0);

wherein said IFDS, once is described in term of change in-between two consecutive bits is then described in term of number of bits in consecutive groups of bits;

wherein the bits in each of the said consecutive groups of bits are of same bit type as either 0 (0 logic) or 1 (1 logic) and wherein said bit type in any two of said consecutive groups of bits are of the opposite type, or alternating from 0 to 1 or from 1 to 0;

a first bit in the said IFDS is used as reference to determine the bit type in every of said consecutive groups of said alternating same type bits.

3. The method of claim 1 comprising:

the said preferred bit pattern is a group of a certain number of bits of same bit type;

wherein the said lower grade is a group or combination of groups of bits of a number of bits of same bit type wherein the number is smaller than the number of bits in said preferred bit pattern; and wherein the said higher grade is a group of bits of a number of bits of same bit type wherein the number is larger than the number of bits in said preferred bit pattern.

4. The method of claim 1 comprising:

the said preferred bit pattern is a group of four bits of same bit type;

the said lower grade is a group or combination of groups of one, two, or three bits of same bit type;

the said higher grade is a group of five or more bits of same bit type.

5. The method of claim 1 further comprising:

a group of last bits in the said IFDS;

wherein the size of said group of last bits depends on the size of said maximum characteristic number and on the number of bits in said group of preferred bit pattern;

wherein said group of last bits may contain one or more groups of said preferred pattern, or of lower grade, or of higher grade; and wherein said group of last bits is modelled and formatted differently than the rest of the bits in the said IFDS, respectively differently than said first group, said exception group, said first full group, and said second full group.

6. The method of claim 5 wherein said partitioned IFDS into well defined consecutive segments and into said last string is modelled and formatted into a unique equivalent output string, wherein each of said consecutive segments is modelled and formatted into a unique equivalent output segment, comprising:
- (a) describing, modelling, and formatting said first full group and said second full group, comprising:
  - the number of all possible binary combinations of bits in a group characterized by a said accepted characteristic number depends on the said characteristic number;
  - the number of all acceptable binary combinations of bits in a group characterized by a said accepted characteristic number is smaller than said possible binary combinations, when the said characteristic number is larger or equal to the number of bits in the said preferred bit pattern, where said number of acceptable binary combinations is smaller than said possible binary combinations because the possible binary combinations that contain groups of said preferred bit pattern or said higher grade are not accepted as acceptable binary combinations, which acceptable binary combinations contain only groups of said lower grade;
  - the said number of acceptable binary combinations is equal to the said number of possible binary combinations when the said characteristic number is smaller than the number of bits in said preferred bit pattern, where the number of said acceptable binary combinations is equal to said possible binary combinations because since said characteristic number is smaller than said preferred bit pattern, binary combinations within said possible binary combinations that have groups of bits of said preferred bit pattern or said higher grade cannot exist;
  - each of the said acceptable binary combination is uniquely described by an orderly combination of said possible binary combination (orderly possible binary combination) wherein orderly means in a specific controlled order;
  - the difference between the said number of possible binary combinations and the said number of acceptable binary combinations are called remain combinations;
  - each of the said remain combinations is uniquely described by a said orderly possible binary combination that was not used to describe any of the said acceptable binary combinations;
  - the number of said acceptable binary combinations plus the number of said remain combinations is equal to the number of said possible binary combinations;
  - a determined set of groups of bits each characterized by a said characteristic number belonging to the said set of accepted characteristic numbers generate said remain combinations;
  - all the rest of groups each characterized by one of all other characteristic numbers in the said set of accepted characteristic numbers that are not used by the said determined set of groups, are using said generated remain combinations;
  - wherein the number of all possible binary combinations of bits generated by one remain combination when this remain combination is used depends on the difference between the characteristic number of the group using the remain combination and the characteristic number of the group generating the remain combination;
  - an identifier that immediately precedes a said orderly possible binary combination;
  - wherein the total number of such identifiers is limited;
  - a specially assigned bit placed immediately after said orderly possible binary combination of a previous of said consecutive segments wherein said specially assigned bit specifies if the first bit in a current of said consecutive segments is of same type or of opposite type as the last bit in said previous of said consecutive segments, and where the specially assigned bit is used when said previous of said consecutive segments is of said first full group type;
  - wherein the size, or number of bits of such identifiers, is such that the number of bits of such identifiers plus the number of bits of said orderly possible binary combination plus the said specially assigned bit is smaller of equal to the number of bits of the said characteristic number plus the number of bits in the said preferred bit pattern;
  - wherein a said consecutive segment of said first full group type is modelled and formatted by a said identifier followed by a said orderly possible binary combination followed by a said specially assigned bit, resulting in an equivalent first output segment of said first full group;
  - wherein a said consecutive segment of said second full group type is modelled and formatted by a said identifier followed by a said orderly possible binary combination, resulting in an equivalent second output segment of said second full group;
- (b) describing, modelling, and formatting said first group and said exception group, comprising:
  - an id-fier that is used to describe the said first group or said exception group;
  - wherein the total number of such id-fiers is limited; and
  - wherein the number of bits of a said id-fier depends on the number of bits in said preferred bit pattern or said exception group such that the number of bits in said id-fier is smaller or equal to the number of bits for the smallest content of said first group or said exception group;
  - wherein a said consecutive segment of said first group or of said exception group consisting of said preferred bit pattern is modelled and formatted by a said id-fier, resulting in an equivalent third output segment of said first group or of said exception group;
  - wherein a said consecutive segment of said first group or of said exception group consisting of said higher grade is modelled and formatted by a said id-fier followed by well defined number of bits with said well defined number of bits plus the number of bits in said id-fier equals to the number of bits in said consecutive segment, resulting in an equivalent fourth output segment of said first group or of said exception group;
- (c) wherein by assembling said described, modelled and formatted consecutive segments and said last string in the same order as said consecutive segments were portioned in said IFDS, an output string that is equivalent to said IFDS is obtained.

7. The method of claim 5, further comprising:
- a combination of a reduced set of said modelled and formatted consecutive segments which exist within a slice of said output string;
- wherein said identifiers and said id-fiers create a pool of ids;
- wherein the said combination refers to combining two or more of either said ids, or, said orderly possible binary combinations, or select bits of said orderly possible binary combinations that are constituent of said reduced set of modelled and formatted consecutive segments;

wherein said ids, said orderly possible binary combinations, representing said reduced set of modelled and formatted consecutive segments, constitute a reduced set of total pool of said ids, respectively a reduced set of total said orderly possible combinations specific to a reduced set of said characteristic numbers; and wherein said combination can be between said ids, said orderly possible binary combinations that are consecutive or within a limited distance from each other.

8. The method of claim 5, further comprising:

a limited number of binary words;

wherein said identifiers and said id-fiers create a pool of ids;

wherein said binary words are formed by comprising ids only, or ids and select bits that are part of said orderly possible binary combinations;

wherein said binary words are formed such that each of said binary words represent the least number of bits that are common to a collection of said ids only or said ids followed by said orderly possible binary combinations that describe only one of said characteristic numbers, and such that in order to fully describe all possible binary combinations of every individual characteristic number, the least number of said binary words are necessary.

9. The method of claim 8 wherein any of said binary words is transformed in an equivalent form to the original binary word form, wherein said equivalent form has the same or smaller number of bits as said original binary word form, wherein in special circumstances the said equivalent form may have a larger number of bits than said original binary word form, and where the transformation is done for such objectives as to improve the method performances.

10. The method of claim 8, wherein:

any one of said modelled and formatted consecutive segments is partitioned in two parts, wherein one part consists of the applicable of said binary words, and the second part is the remainder after the said applicable binary word is removed; and the part containing the said applicable binary word partition and where the part containing the said remainder partition are processed separately.

11. The method of claim 10 wherein the said part containing the said applicable binary word partition is processed by combining two or more of said binary words that are either consecutive or within a defined distance from each other.

12. The method of claim 11 wherein:

the said processed by combining refers to pairing every two of said binary words;

wherein after said pairing, a new optimized binary combination is assigned to each pair; and said new optimized binary combination has optimized properties, such as it is unique and it has minimum number of bits, where said minimum number of bits is smaller or equal to the number of bits in the two said binary words creating the pair.

13. The method of claim 5, wherein said IFDS is partitioned in multiple slices, and where multiple parallel devices are used where each device is processing one of said multiple slices, and where the output of each of said multiple devices is merged in the same order in which it was partitioned, and where the resulting merged output represents the total output.

14. The method of claim 5 wherein the said IFDS to be processed is pre-processed to determine the optimal way this processing can be done to achieve optimal performances, and where said pre-processing can include any optimizations, such as in re-assigning said orderly possible binary combinations or said pool of ids or said alternating same type bits, or such as adjusting the size of the said preferred bit pattern.

15. The method of claim 5 wherein said output string is partitioned in one or more slices and wherein within each of said slices the said acceptable and said remain combinations are reassigned to binary combinations of different properties, where such different properties may be either of less number of bits, or properties that eliminate a specific undesired bit pattern.

16. The method of claim 7 wherein the said reduced set of total pool of ids or said reduced set of total orderly possible binary combinations corresponding to the said reduced set of characteristic numbers are changed, wherein changed comprises reassigned or adjusted in size and number of bits, such as reassigned to a representation having a smaller number of bits, in order to achieve optimal performances.

17. A method comprising:

describing an arbitrary binary input string in term of groups of alternating same type bits;

partitioning said described input string in consecutive segments based on identifying a group of preferred bit pattern or a predetermined number of bits, wherein each of said segments comprising a group of preferred bit pattern and one or more groups of lower grade, or comprising a group of preferred bit pattern or of higher grade, or comprising a fixed length group of several said lower grade groups, wherein said lower grade and higher grade are formulated relative to the characteristics of the said group of preferred bit pattern;

modelling and converting each of said segments in a unique, optimized, equivalent output structure comprising an identifier that may be associated to an orderly possible binary combination; and assembling said modelled and converted segments to form an output string that equivalently represents said input string.

18. A method wherein an arbitrary binary input string is processed comprising:

first describing the said binary input string in term of alternating same type bits;

formatting said first described string comprising one or more of or a combination of a group of preferred bit pattern and one or more groups of lower grade, or a group of preferred bit pattern, or a group of higher grade;

wherein said lower grade and higher grade are formulated relative to the characteristics of the said group of preferred bit pattern; and modelling and converting said first formatted string in a first unique, optimized, equivalent output structure comprising identifiers that may be associated to orderly possible binary combinations;

second describing same said binary input string in term of change in-between two consecutive bits which is then described in term of alternating same type bits;

formatting said second described string comprising one or more or a combination of a group of preferred bit pattern and one or more groups of lower grade, or a group of preferred bit pattern or a group of higher grade;

modelling and converting said second formatted string in a second unique, optimized, equivalent output structure comprising identifiers that may be associated to orderly possible binary combinations; and comparing the said first unique, optimized, equivalent output structure to the said second unique, optimized, equivalent output structure, and either the said first or the said second output structure is chosen as the final output based on specific determined criteria.

19. The method of claim 17 wherein specific and representative parts of two or more of said unique, optimized, equivalent output structures corresponding to two of said segments are paired to generate new optimized binary combinations, wherein the said representative parts can be consecutive or within a predefined distance from each other, and wherein the said distance is measured in said segments or relevant bits.

20. The method of claim 19, wherein an input string comprising of multiple of said binary segments is processed in hardware or software.

21. The method of claim 20, wherein customizable settings are used to optimize and reconfigure the hardware or software implementation options, resulting in optimized performances.

22. The method of claim 20, wherein the processing is repeated in a loop of multiple processing cycles when the output of current processing cycle is used as input for the next processing cycle, and where this repeated loop processing is tracked by specific constructs such as counters.

23. The method of claim 17 wherein every of the said segments retrieves a said unique, optimized, equivalent output structure that uniquely corresponds to each of said every unique segments, and wherein the reverse applies, meaning every said unique, optimized, equivalent output structure retrieves a unique said segment that uniquely corresponds to each of said every unique optimized, equivalent output structure.

24. A method comprising:

partitioning of an arbitrary binary input string wherein said partitioning occurs every time a group of preferred bit pattern is detected;

describing the bits in-between any two consecutive such detections in term of specially formulated properties;

setting a maximum size of a partition when such detection does not occur, and describing the bits in the said maximum size partition in term of specially formulated properties;

such that any of said arbitrary binary input string can be continuously and fully represented by such said partitions, said maximum size partitions, and said groups of preferred bit pattern.

25. The method of claim 24 comprising:

modelling and converting each of said partitions, said maximum size partitions, and said groups of preferred bit pattern into an unique equivalent construct;

assembling said unique equivalent constructs of their corresponding said partitions, said maximum size partitions, and said groups of preferred bit pattern;

wherein said assembling generates an output string that uniquely represents said input string.

26. The method of claim 25 wherein a set comprising a well defined number of unique identifiers is defined in order to represent any and all possible said unique equivalent constructs, wherein said set consequently is used to represent any said output string and consequently any said arbitrary binary input string.

27. A method, comprising:

describing an arbitrary binary input string in term of alternating same type bits;

locating in said described string groups of bits of a preferred bit pattern wherein all other groups of bits in said described string are either of a lower or of a higher grade;

classifying the bits in-between two consecutive said groups of preferred bits;

defining a characteristic number for the said bits in-between said groups of preferred bits wherein said characteristic number is between one and a well defined maximum value;

modelling said bits in-between said consecutive groups of preferred bits, said groups of bits of preferred bit pattern, said groups of lower grade, and said groups of higher grade;

enabling the definition of a finite pool of unique identifiers that facilitate the unique transformation of any of said modelled groups into an equivalent output format;

formulating the group of bits comprising last bits in said input string;

formatting said modelled groups, said preferred groups and said high order groups, using said finite pool of unique identifiers;

linking said formatted groups with each other; and assembling said formatted and linked groups into a unique output string that is uniquely equivalent with said input string, wherein said uniquely equivalent comprising same size;

wherein all steps insure unique processing such that the reverse process that starts with the said output string generates an identical string to said input string, and wherein said reverse process comprising equivalent reverse steps.

28. A method comprising:

developing a set of well defined binary constructs comprising a finite number of subsets of said binary constructs wherein each of said subsets has a finite number of members of a same number of bits, and wherein the members of every subset has a different number of bits;

uniquely describing any arbitrary binary input string using said set of well defined binary constructs, wherein said describing generates a unique output string that is equivalent with said input string; and reversing said unique output string to obtain the same said arbitrary binary input string using said set of well defined binary constructs.

* * * * *

UNITED STATES PATENT AND TRADEMARK OFFICE
CERTIFICATE OF CORRECTION

| | |
|---|---|
| PATENT NO. | : 11,677,416 B2 |
| APPLICATION NO. | : 17/398728 |
| DATED | : June 13, 2023 |
| INVENTOR(S) | : Radu Mircea Secareanu |

It is certified that error appears in the above-identified patent and that said Letters Patent is hereby corrected as shown below:

On the Title Page

Delete the title page and substitute therefore with the attached title page consisting of the corrected illustrative figure.

In the Claims

Claim 7, Column 38, Line 59, the claim reference "claim 5" should read --claim 6--.

Claim 8, Column 39, Line 13, the claim reference "claim 5" should read --claim 6--.

Claim 13, Column 39, Line 61, the claim reference "claim 5" should read --claim 6--.

Claim 14, Column 40, Line 1, the claim reference "claim 5" should read --claim 6--.

Claim 15, Column 40, Line 9, the claim reference "claim 5" should read --claim 6--.

Signed and Sealed this
Twenty-first Day of November, 2023

*Katherine Kelly Vidal*

Katherine Kelly Vidal
*Director of the United States Patent and Trademark Office*

(12) United States Patent
Secareanu

(10) Patent No.: US 11,677,416 B2
(45) Date of Patent: Jun. 13, 2023

(54) HARDWARE IMPLEMENTABLE DATA COMPRESSION/DECOMPRESSION ALGORITHM

(71) Applicant: Radu Mircea Secareanu, Phoenix, AZ (US)

(72) Inventor: Radu Mircea Secareanu, Phoenix, AZ (US)

(73) Assignee: Radu Mircea Secareanu, Phoenix, AZ (US)

( * ) Notice: Subject to any disclaimer, the term of this patent is extended or adjusted under 35 U.S.C. 154(b) by 0 days.

(21) Appl. No.: 17/398,728

(22) Filed: Aug. 10, 2021

(65) Prior Publication Data
US 2022/0368345 A1 Nov. 17, 2022

Related U.S. Application Data

(60) Provisional application No. 63/189,247, filed on May 17, 2021.

(51) Int. Cl.
*H03M 7/30* (2006.01)
*H03M 7/40* (2006.01)

(52) U.S. Cl.
CPC ...... *H03M 7/3064* (2013.01); *H03M 7/4031* (2013.01); *H03M 7/6005* (2013.01)

(58) Field of Classification Search
None
See application file for complete search history.

(56) References Cited

U.S. PATENT DOCUMENTS

| | | | | |
|---|---|---|---|---|
| 3,656,178 A * | 4/1972 | De Maine | | H03M 7/3066 341/87 |
| 3,914,586 A * | 10/1975 | McIntosh | | H03M 7/30 341/68 |
| 4,021,782 A * | 5/1977 | Hoerning | | H03M 7/42 341/51 |
| 5,036,457 A * | 7/1991 | Glaser | | G06F 7/00 703/22 |
| 5,298,895 A * | 3/1994 | Van Maren | | G11B 20/00007 341/51 |
| 5,363,098 A * | 11/1994 | Antoshenkov | | G06T 9/005 341/95 |

(Continued)

*Primary Examiner* — Lam T Mai

(57) ABSTRACT

A hardware implementable lossless data compression decompression algorithm is disclosed, where the input data string is described in term of consecutive groups of alternating same type bits, where one of these groups of same type bits is defined as a preferred group with the other groups having either lower or higher number of same type bits, where the data string is partitioned into variable length processing strings where the variable length is determined by the occurrence of the preferred group or of a determined number of bits consisting of groups of lower number of same type bits, where these variable length processing strings are processed function of the configuration and content of each processing string only, where consecutive processing strings are additionally processed based on their content only, where processing is performed in a loop until a certain target performance is achieved, where processing is done without any data analysis, and where no negative compression gain is achieved for any content of an input string.

28 Claims, 17 Drawing Sheets